US009786778B1

(12) United States Patent
Morizuka

(10) Patent No.: US 9,786,778 B1
(45) Date of Patent: Oct. 10, 2017

(54) SEMICONDUCTOR DEVICE

(71) Applicant: KABUSHIKI KAISHA TOSHIBA, Minato-ku, Tokyo (JP)

(72) Inventor: Kohei Morizuka, Hyogo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/249,724

(22) Filed: Aug. 29, 2016

(30) Foreign Application Priority Data

May 30, 2016 (JP) .................................. 2016-107752

(51) Int. Cl.
*H01L 29/78* (2006.01)
*H01L 29/16* (2006.01)
*H01L 29/10* (2006.01)
*H01L 29/06* (2006.01)
*H01L 27/088* (2006.01)

(52) U.S. Cl.
CPC ........ *H01L 29/7806* (2013.01); *H01L 27/088* (2013.01); *H01L 29/0619* (2013.01); *H01L 29/1095* (2013.01); *H01L 29/1608* (2013.01)

(58) Field of Classification Search
CPC ......... H01L 29/78; H01L 29/16; H01L 29/10; H01L 29/06; H01L 27/088
See application file for complete search history.

(56) References Cited

U.S. PATENT DOCUMENTS 5,679,966 A * 10/1997 Baliga ................ H01L 29/7391
257/139
7,151,280 B2 12/2006 Hayashi et al.
7,638,841 B2 * 12/2009 Challa ................ H01L 21/3065
257/331

(Continued)

FOREIGN PATENT DOCUMENTS

JP 2007-305836 A 11/2007
JP 5396953 B2 1/2014

(Continued)

OTHER PUBLICATIONS

Henning et al.: "Electrical Characteristics of Rectifying Polycrystalline Silicon/Silicon Carbide Heterojunctions", Journal of Electronic Materials, vol. 27, No. 4, 1998, pp. 296-299.

(Continued)

*Primary Examiner* — Asok K Sarkar
*Assistant Examiner* — Dmitry Yemelyanov

(57) ABSTRACT

A semiconductor device including a first electrode, a second electrode, and a silicon carbide layer of which at least a portion is provided between the first electrode and the second electrode, the silicon carbide layer including an n-type first silicon carbide region, a plurality of p-type second silicon carbide regions, and a plurality of n-type third silicon carbide regions. The semiconductor device further includes a plurality of first conductive layers each of which is in contact with the n-type first silicon carbide region, a number n, n being 2, 3, 4 or 5, of first gate electrodes that are provided between two adjacent first conductive layers of the plurality of first conductive layers, and extend in the first direction, and a plurality of first gate insulating layers each of which is provided between one of the n first gate electrodes and the n-type first silicon carbide region.

16 Claims, 29 Drawing Sheets

(56) References Cited

U.S. PATENT DOCUMENTS

| | | | |
|---|---|---|---|
| 7,751,215 B2 | 7/2010 | Kitabatake | |
| 8,592,895 B2* | 11/2013 | Yilmaz | H01L 29/66727 |
| | | | 257/330 |
| 8,669,623 B2* | 3/2014 | Pan | H01L 29/42368 |
| | | | 257/281 |
| 8,835,934 B2 | 9/2014 | Mizukami | |
| 2005/0167742 A1* | 8/2005 | Challa | H01L 21/3065 |
| | | | 257/328 |

FOREIGN PATENT DOCUMENTS

| | | |
|---|---|---|
| JP | 5428144 B2 | 2/2014 |
| JP | 2015-198228 A | 11/2015 |
| WO | WO-2005/065385 A2 | 7/2005 |

OTHER PUBLICATIONS

Kimoto, Tsunenobu: "Material science and device physics in SiC technology for high-voltage power devices", Japanese Journal of Applied Physics 54, 040103, 2015, pp. 1-27.

Ni et al.: "SiC Trench MOSFET with an integrated Low Von Unipolar Heterojunction Diode", Materials Science Forum, vols. 778-780, 2014, pp. 923-926.

* cited by examiner

SEMICONDUCTOR DEVICE

CROSS-REFERENCE TO RELATED APPLICATION

This application is based upon and claims the benefit of priority from Japanese Patent Application No. 2016-107752, filed on May 30, 2016; the entire contents of which are incorporated herein by reference.

FIELD

Embodiments described herein relate generally to a semiconductor device.

BACKGROUND

Silicon carbide is expected to be a material in next generation semiconductor devices. Silicon carbide has excellent physical properties in which a bandgap is approximately three times that of silicon, breakdown electric field strength is approximately ten times that of silicon, and thermal conductivity is approximately three times that of silicon. It is possible to achieve a semiconductor device in which a loss is low and a high-temperature operation is possible by using these characteristics.

A metal oxide semiconductor field effect transistor ("MOSFET") using silicon carbide has an operation mode called a reverse conduction state in addition to a typical operation mode. In the typical operation mode, a drain electrode is positively biased with respect to a source electrode, and thus a current flows from the drain electrode toward the source electrode. On the other hand, in the reverse conduction state, the drain electrode is negatively biased with respect to the source electrode, and a current flows from the source electrode toward the drain electrode. In the reverse conduction state, a built-in diode of the MOSFET is turned on, and thus a current flows.

The built-in diode of the MOSFET is a pn-junction diode. In the reverse conduction state, holes are injected to a drift layer from a source electrode side, and electrons are injected to the drift layer from a drain electrode side. A stacking defect from an electric potential in the drift layer may grow due to recoupling energy of the holes and the electrons which are injected to the drift layer. When the stacking defect grows in the drift layer, on-state resistance increases. This problem is referred to as conduction deterioration. The reliability of the MOSFET deteriorates due to the conduction deterioration.

DETAILED DESCRIPTION

Figure 1:
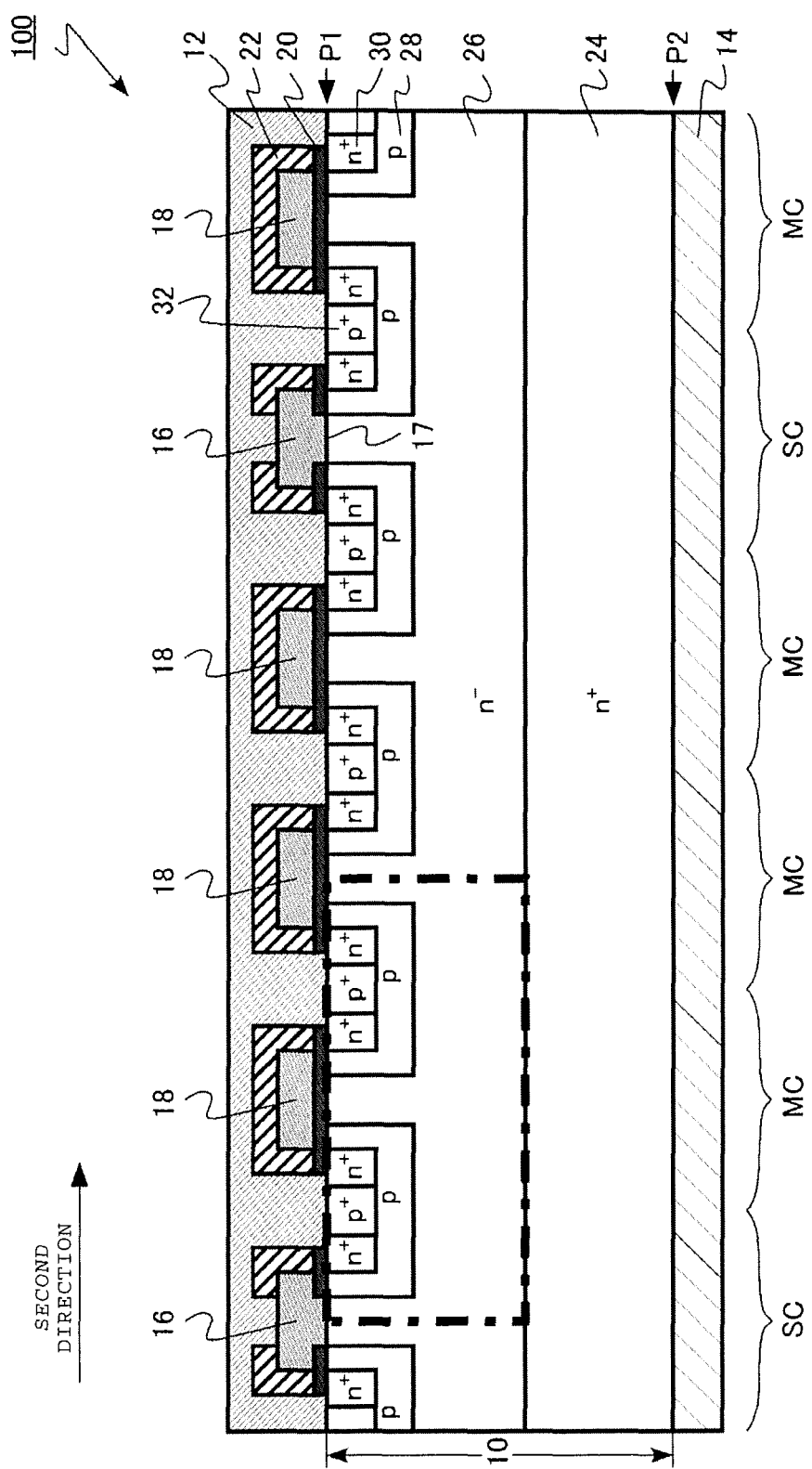
FIG. 1 is a schematic cross-sectional view of a semiconductor device according to a first embodiment.

According to some embodiments, there is provided a semiconductor device capable of suppressing conduction deterioration.

In general, according to some embodiments, there is provided a semiconductor device including: a first electrode; a second electrode; a silicon carbide layer of which at least a portion is provided between the first electrode and the second electrode; an n-type first silicon carbide region that is provided in the silicon carbide layer; a plurality of p-type second silicon carbide regions that are provided in the silicon carbide layer and between the n-type first silicon carbide region and the first electrode, and extend in a first direction; a plurality of n-type third silicon carbide regions each of which is provided in the silicon carbide layer and between each of the p-type second silicon carbide regions and the first electrode, has an n-type impurity concentration higher than an n-type impurity concentration of the n-type first silicon carbide region, and is electrically connected to the first electrode; a plurality of first conductive layers each of which is in contact with the n-type first silicon carbide region that is provided between two adjacent p-type second silicon carbide regions among the plurality of p-type second silicon carbide regions, extends in the first direction, is provided in a first period, and is electrically connected to the first electrode; n (n=2, 3, 4, or 5) first gate electrodes that are provided between two adjacent first conductive layers among the plurality of first conductive layers, and extend in the first direction; and a plurality of first gate insulating layers each of which is provided between each of the n first gate electrodes and the n-type first silicon carbide region.

Hereinafter, example embodiments will be described with reference to the accompanying drawings. Furthermore, in the following description, the same reference numeral will be given to similar members and the like, and description thereof will be appropriately omitted.

In addition, in the following description, notations of "n$^+$", "n", "n$^-$", "p$^+$", "p", and "p$^-$" represent relative magnitudes of impurity concentrations in respective conductivity types. That is, "n$^+$" represents that an n-type impurity (or dopant) concentration is relatively higher in comparison to "n", and "n$^-$" represents that the n-type impurity concentration is relatively lower in comparison to "n". Furthermore, represents that a p-type impurity concentration is relatively higher in comparison to "p", and "p$^-$" represents that the p-type impurity concentration is relatively lower in comparison to "p". Furthermore, "n$^+$-type" and "n$^-$-type" may be described as "n-type", and "p$^+$-type" and "p$^-$-type" may be described as "p-type".

For example, the impurity concentration can be measured by secondary ion mass spectrometry ("SIMS"). In addition, for example, the relative magnitude of the impurity concentration can be determined from a magnitude of a carrier concentration that is obtained by scanning capacitance microscopy ("SCM"). In addition, for example, a distance such as a depth of an impurity region can be obtained by the SIMS. In addition, for example, the distance such as the depth of the impurity region can be obtained from a composite image of an SCM image and an atomic force microscope ("AFM") image.

In the description of some embodiments, "approximately" when used with reference to a numerical value can encompass a range of variation of less than or equal to ±5% of the numerical value, such as less than or equal to ±4%, less than or equal to ±3%, less than or equal to ±2%, or less than or equal to ±1%. In the description of some embodiments, when referring to two values or characteristics as being substantially the same or equal, the term can refer to a first value or characteristic being precisely the same or equal to a second value or characteristic, as well as cases where the first value or characteristic is within a range of variation of less than or equal to ±5% of the second value or characteristic, such as less than or equal to ±4%, less than or equal to ±3%, less than or equal to ±2%, or less than or equal to ±1%. By "perpendicular" or "orthogonal," the terms can refer to precisely 90° as well as a range of variation of less than or equal to ±5° relative to 90°, such as less than or equal to ±4°, less than or equal to ±3°, less than or equal to ±2°, or less than or equal to ±1°. In the description of some embodiments, an element provided "on" another element can encompass cases where the former element is directly on (e.g., in physical contact with) the latter element, as well as cases where one or more intervening elements are located between the former element and the latter element.

First Embodiment

A semiconductor device according to this example embodiment includes: a first electrode; a second electrode; a silicon carbide layer of which at least a portion is provided between the first electrode and the second electrode; an n-type first silicon carbide region that is provided in the silicon carbide layer; a plurality of p-type second silicon carbide regions which are provided in the silicon carbide layer and between the n-type first silicon carbide region and the first electrode, and extend in a first direction; a plurality of n-type third silicon carbide regions each of which is provided in the silicon carbide layer and between each of the p-type second silicon carbide regions and the first electrode, has an n-type impurity concentration higher than an n-type impurity concentration of the n-type first silicon carbide region, and is electrically connected to the first electrode; a plurality of first conductive layers each of which is in contact with the n-type first silicon carbide region that is provided between two adjacent p-type second silicon carbide regions among the plurality of p-type second silicon carbide regions, extends in the first direction, is provided in a first period, and is electrically connected to the first electrode; n (n=2, 3, 4, or 5) first gate electrodes which are provided between two adjacent first conductive layers among the plurality of first conductive layers, and extend in the first direction; and a plurality of first gate insulating layers each of which is provided between each of the n first gate electrodes and the n-type first silicon carbide region.

FIG. 1 is a schematic cross-sectional view of the semiconductor device according to this embodiment. The semiconductor device according to this embodiment is an n-type vertical MOSFET 100 in which silicon carbide is used and in which an electron is set as a carrier. The MOSFET 100 in this embodiment includes a Schottky barrier diode ("SBD") in a chip.

The MOSFET 100 includes an MOSFET cell ("MC") and an SBD cell ("SC") which are regularly arranged. The MOSFET 100 can include a plurality of MOSFET cells and a plurality of SBD cells which are regularly arranged. Hereinafter, description will be given for a case where n is set as 3 as an example.

Figure 2:
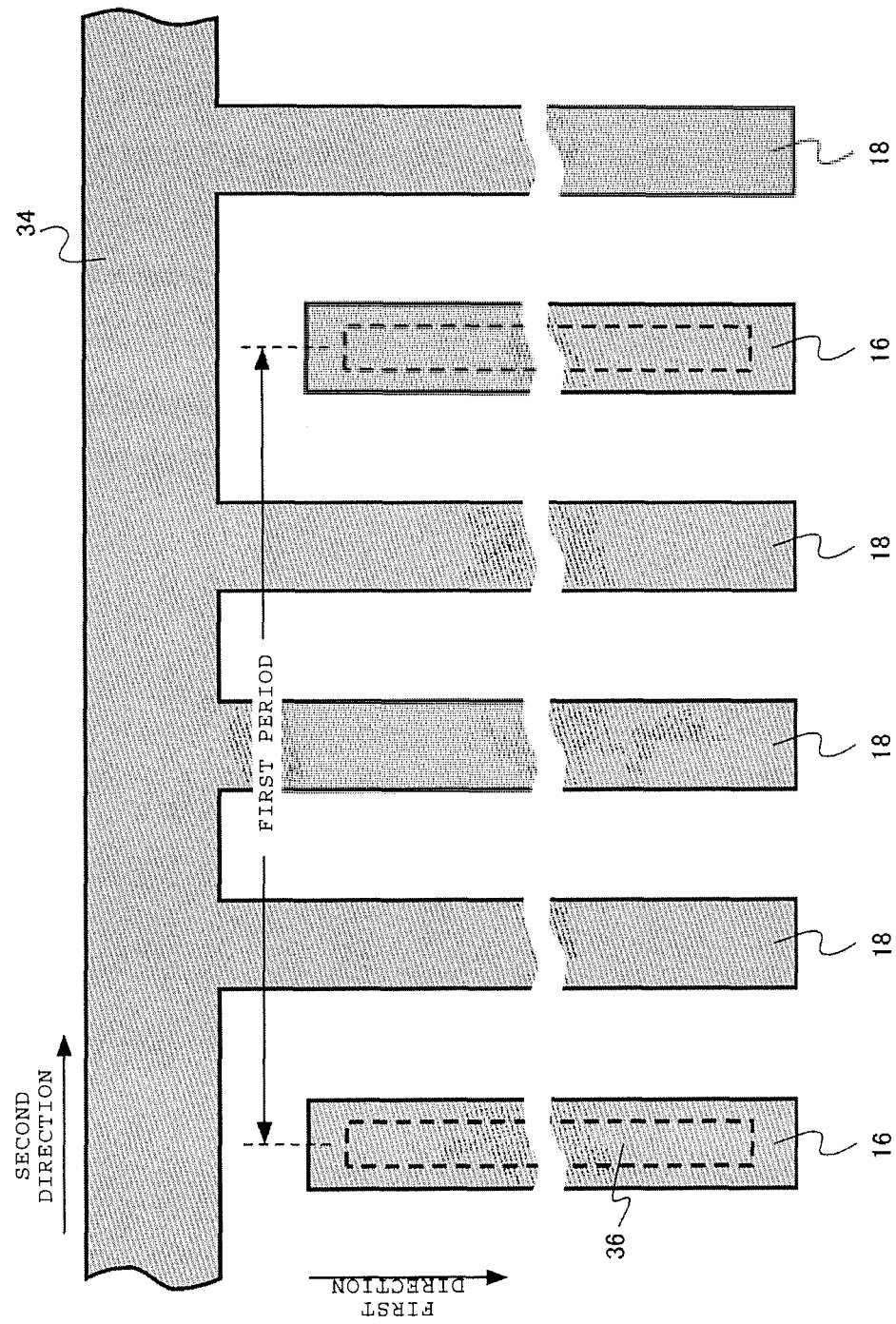
FIG. 2 is a schematic plan view of the semiconductor device according to the first embodiment.

The MOSFET 100 includes a silicon carbide layer 10, a source electrode (first electrode) 12, a drain electrode (second electrode) 14, an anode electrode (first conductive layer) 16, an SBD region 17, a gate electrode (first gate electrode) 18, a gate insulating film (first gate insulating layer) 20, an interlayer insulating film 22, and a gate connection layer (gate layer) 34 (see FIG. 2).

An n$^+$-type drain region 24, an n$^-$-type drift region (n-type first silicon carbide region) 26, a p-type base region (p-type second silicon carbide region) 28, an n$^+$-type source region (n-type third silicon carbide region) 30, a p$^+$-type contact region (p-type fourth silicon carbide region) 32 are provided in the silicon carbide layer 10.

The silicon carbide layer 10 is a single-crystal silicon carbide ("SiC"). For example, the silicon carbide layer 10 is 4H—SiC. At least a portion of the silicon carbide layer 10 is provided between the source electrode 12 and the drain electrode 14.

The silicon carbide layer 10 includes a first plane ("P1" in FIG. 1) and a second plane ("P2" in FIG. 1). Hereinafter, the first plane is also referred to as a front surface and the second plane is also referred to as a rear surface. Furthermore, hereinafter, "depth" represents a depth with the first plane set as a reference.

The first plane is a plane that is inclined by 0° to approximately 8° with respect to, for example, a (0001) plane. In addition, the second plane is a plane that is inclined by 0° to approximately 8° with respect to, for example, a (000-1) plane. The (0001) plane is also referred to as a silicon plane. The (000-1) plane is also referred to as a carbon plane.

The $n^+$-type drain region 24 is provided on a rear surface side of the silicon carbide layer 10. For example, the drain region 24 contains nitrogen (N) as an n-type impurity. For example, an impurity concentration of the n-type impurity of the drain region 24 is in a range of approximately $1\times10^{18}$ $cm^{-3}$ to approximately $1\times10^{21}$ $cm^{-3}$.

The $n^-$-type drift region 26 is provided on the drain region 24. For example, the drift region 26 contains nitrogen (N) as an n-type impurity. An impurity concentration of the n-type impurity in the drift region 26 is lower than the impurity concentration of the n-type impurity of the drain region 24.

For example, the impurity concentration of the n-type impurity of the drift region 26 is in a range of approximately $4\times10^{14}$ $cm^{-3}$ to approximately $6\times10^{16}$ $cm^{-3}$. For example, the thickness of the drift region 26 is in a range of approximately 5 μm to approximately 150 μm.

The p-type base region 28 is provided between the drift region 26 and the source electrode 12. The base region 28 is provided between the drift region 26 and the front surface of the silicon carbide layer 10. The base region 28 functions as a channel region of the MOSFET 100.

For example, the p-type base region 28 is provided in a predetermined second period in a second direction. When a number of gate electrodes 18 of a plurality of the gate electrodes 18, which are provided between two adjacent anode electrodes 16 among a plurality of the anode electrodes 16, is set as n, the second period is set as approximately 1/(n+1) times a first period to be described later. In this embodiment, the number of the gate electrodes 18 is set as 3, and thus the second period is approximately ¼ times the first period.

For example, the base region 28 contains aluminum (Al) as a p-type impurity. For example, an impurity concentration of the p-type impurity in the base region 28 is in a range of approximately $1\times10^{17}$ $cm^{-3}$ to approximately $5\times10^{17}$ $cm^{-3}$. For example, the depth of the base region 28 is in a range of approximately 0.2 μm to approximately 0.6 μm.

The $n^+$-type source region 30 is provided between the base region 28 and the source electrode 12. The source region 30 is provided between the base region 28 and the front surface of the silicon carbide layer 10.

For example, the source region 30 contains phosphorous (P) as an n-type impurity. An impurity concentration of the n-type impurity in the source region 30 is higher than the impurity concentration of the n-type impurity in the drift region 26.

For example, the impurity concentration of the n-type impurity in the source region 30 is in a range of approximately $1\times10^{19}$ $cm^{-3}$ to approximately $1\times10^{21}$ $cm^{-3}$. For example, the depth of the source region 30 is shallower that the depth of the base region 28 and is, for example, in a range of approximately 0.1 μm to approximately 0.3 μm.

The $p^+$-type contact region 32 is provided between the base region 28 and the source electrode 12. The contact region 32 is provided between source regions 30. A p-type impurity concentration of the contact region 32 is higher than the impurity concentration of the p-type impurity in the base region 28.

The contact region 32 has a function of reducing contact resistance of the source electrode 12.

For example, the contact region 32 contains aluminum (Al) as a p-type impurity.

FIG. 2 is a schematic plan view of the semiconductor device according to this embodiment. FIG. 2 illustrates an example arrangement of the anode electrode 16 and the gate electrode 18.

The anode electrode 16 is provided to be in contact with the drift region 26 between two adjacent base regions 28 among a plurality of the base regions 28. The anode electrode 16 extends in a first direction as illustrated in FIG. 2. The anode electrode 16 can be repetitively provided every first period in the second direction that is perpendicular to a first direction.

The anode electrode 16 functions as an anode electrode of the SBD.

The anode electrode 16 is p-type polycrystalline silicon (or polycrystal silicon) that contains a p-type impurity. For example, the anode electrode 16 is formed from the same material as that of the gate electrode 18. For example, the anode electrode 16 is formed simultaneously with the gate electrode 18. For example, the anode electrode 16 and the gate electrode 18 are formed in a single formation process. Furthermore, the anode electrode 16 may be n-type polycrystal silicon that contains an n-type impurity.

The anode electrode 16 is in contact with the drift region 26 at an opening that is provided in the gate insulating film 20. The SBD region 17 includes at least a portion of an interface or junction at which the anode electrode 16 is in contact with the drift region 26 through the opening.

A junction between the anode electrode 16 and the drift region 26 is a hetero-junction. A junction between p-type polycrystal silicon and SiC achieves similar current and voltage characteristics as those of a Schottky junction due to a hetero-junction barrier of approximately 1.5 eV.

The anode electrode 16 is electrically connected to the source electrode 12. The anode electrode 16 is in contact with the source electrode 12 at an opening (rectangle indicated by a broken line in FIG. 2) 36 that is provided in the interlayer insulating film 22.

The gate electrode 18 is provided between the two adjacent anode electrodes 16. In this embodiment, three gate electrodes 18 are provided between the two adjacent anode electrodes 16. Furthermore, the number of the gate electrodes 18 provided between the two adjacent anode electrodes 16 may be 2, 4, or 5.

As illustrated in FIG. 2, each of the gate electrodes 18 extends in the first direction. An end of the gate electrode 18 is in contact with the gate connection layer 34 that extends in the second direction. Furthermore, the anode electrode 16 is isolated from the gate connection layer 34, and an electric potential is applied to the anode electrode 16 independently from the gate electrode 18.

The gate electrode 18 according to this embodiment is p-type polycrystal silicon that contains a p-type impurity. The gate electrode 18 may be n-type polycrystal silicon that contains an n-type impurity.

The gate insulating film 20 is provided between the gate electrode 18 and the drift region 26 between the two adjacent base regions 28. In addition, the gate insulating film 20 is provided between the gate electrode 18 and the two adjacent base regions 28.

For example, the gate insulating film 20 is a silicon oxide film. For example, a high-k insulating film (high-dielectric-constant insulating film) is applicable to the gate insulating film 20.

The interlayer insulating film 22 is provided on the gate electrode 18. For example, the interlayer insulating film 22 is a silicon oxide film.

The source electrode 12 is provided on the front surface of the silicon carbide layer 10. The source electrode 12 is in contact with the source region 30 and the contact region 32.

The source electrode 12 contains a metal. The metal, which is included in the source electrode 12, has a stacked structure of, for example, titanium (Ti) and aluminum (Al). The source electrode 12 may include metal silicide or metal carbide which is in contact with the silicon carbide layer 10.

The drain electrode 14 is provided on the rear surface of the silicon carbide layer 10. The drain electrode 14 is in contact with the drain region 24.

For example, the drain electrode 14 contains a metal or a metal semiconductor compound. For example, the drain electrode 14 contains a material selected from the group consisting of nickel silicide (NiSi), titanium (Ti), nickel (Ni), silver (Ag), and gold (Au).

In the MOSFET 100 according to this embodiment, the MOSFET cell (MC) and the SBD cell (SC) are periodically arranged in the second direction. Each MOSFET cell includes one of the gate electrodes 18, and each SBD cell includes one of the anode electrodes 16.

In this embodiment, one SBD cell is arranged with respect to three MOSFET cells. For example, when the length of each cell in the second direction is set as approximately 4 μm, the three MOSFET cells and the one SBD cell can be arranged across a chip at a period of approximately 16 μm. In this case, the first period of the MOSFET 100 becomes approximately 16 μm.

Hereinafter, an operation and an effect of the semiconductor device according to this embodiment will be described. FIG. 3 to FIG. 8 are explanatory views of the operation and the effect of this embodiment.

Figure 3:
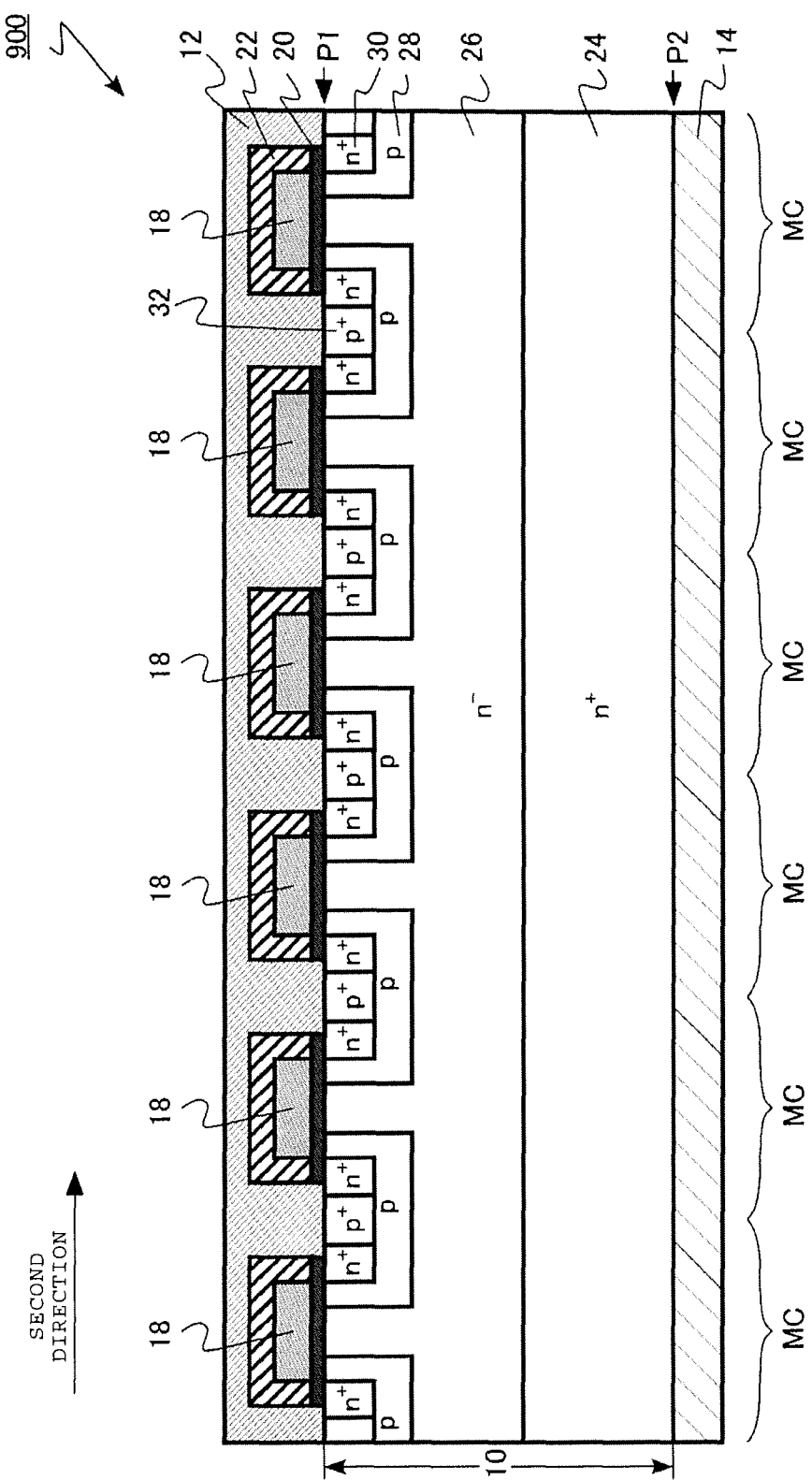
FIG. 3 is an explanatory view of an operation and an effect of the semiconductor device according to the first embodiment.

First, description will be given of an operation of an MOSFET 900 that does not include the SBD cell (SC). FIG. 3 is a schematic cross-sectional view of the MOSFET 900. The MOSFET 900 has a configuration similar to that of the MOSFET 100 in some respects, but does not include the SBD cell (SC).

A main operation of the MOSFET 900 is to control whether a current between the drain electrode 14 and the source electrode 12 is on or off, when the drain electrode 14 is positively biased with respect to the source electrode 12.

When a positive voltage is applied between the gate electrode 18 and the source electrode 12 to induce an electron to an interface of the base region 28 and the gate insulating film 20, an electron channel is formed between the source region 30 and the drift region 26. Accordingly, a current flows between the drain electrode 14 and the source electrode 12, and the MOSFET 900 enters an on-state.

On the other hand, when a voltage between the gate electrode 18 and the source electrode 12 is lowered to reduce a concentration of an electron that is induced to the interface of the base region 28 and the gate insulating film 20, conduction between the source region 30 and the drift region is shut off. Accordingly, the MOSFET 900 enters an off-state.

When the current is shut off, a depletion layer extends from the base region 28 to the drift region 26, and a voltage difference between the drain electrode 14 and the source electrode 12 is held. The impurity concentration and the thickness of the drift region 26 are set so as to maintain a desired insulating breakdown voltage.

The above-described operation is the main operation of the MOSFET 900, and the MOSFET 900 has an operation mode called a reverse conduction state in addition to the main operation. The reverse conduction state corresponds to an operation when the drain electrode 14 is negatively biased with respect to the source electrode 12.

When the drain electrode 14 is negatively biased with respect to the source electrode 12, the p-type base region 28 is positively biased with respect to the n-type drift region 26. According to this, when a voltage between the p-type base region 28 and the n-type drift region 26 exceeds an initial voltage of a pn junction diode between the p-type base region 28 and the n-type drift region 26, a current flows from the source electrode 12 toward the drain electrode 14. This state is the reverse conduction state.

The pn junction diode, which is formed between the p-type base region 28 and the n-type drift region 26 is also referred to as a built-in diode. In the reverse conduction state, a hole is injected to the drift region 26 from the base region 28, and an electron is injected to the drift region 26 from the $n^+$-type drain region 24, and the hole and the electron are re-coupled in the drift region 26.

Conduction deterioration of the built-in diode occurs in the reverse conduction state. In the drift region 26, an electric potential exists along the (0001) plane of SiC, an electric potential to which recoupling energy is added is lowered, and thus a stacking defect grows and expands in the (0001) plane.

Typically, an SiC substrate is cut out from a <0001> direction at a low-off angle (for example, approximately 4°). Accordingly, the stacking defect expands at an orientation that is approximately perpendicular to a conduction direction.

At a portion at which the stacking defect exists, a stacking period falls into disorder. According to this, a band gap varies, and thus an electric potential barrier with respect to a conduction electron occurs. Accordingly, an electric potential barrier in a plane shape perpendicular to a current path appears, and thus resistance increases in combination with conduction with respect to the built-in diode.

The stacking defect operates as an electric potential barrier in the reverse conduction state and also in a forward direction state in which a current flows from a drain to a source. Accordingly, on-state resistance in the forward direction also increases.

Particularly, when an electric field potential which causes the stacking defect along the (0001) plane of SiC exists in a chip having a high density, a percent of the total chip area occupied by the stacking defect in the chip increases in combination with conduction of the built-in diode. In this state, on-state resistance becomes great. Accordingly, an unintended circuit may operate, or the amount of heat generation in an element may increase, and breakdown may occur.

One method of solving a problem related to conduction deterioration of the built-in diode is to improve crystallinity of SiC so as to prevent or reduce an electric potential, which causes the stacking defect, along the (0001) plane from forming. In addition, another method is to determine whether an electric potential, which causes the stacking defect, along the (0001) plane exists using a photoluminescence method or the like. Any chip determined to have an electric potential is sorted and removed from a production line. These methods do not sufficiently solve the problem.

Figure 4:
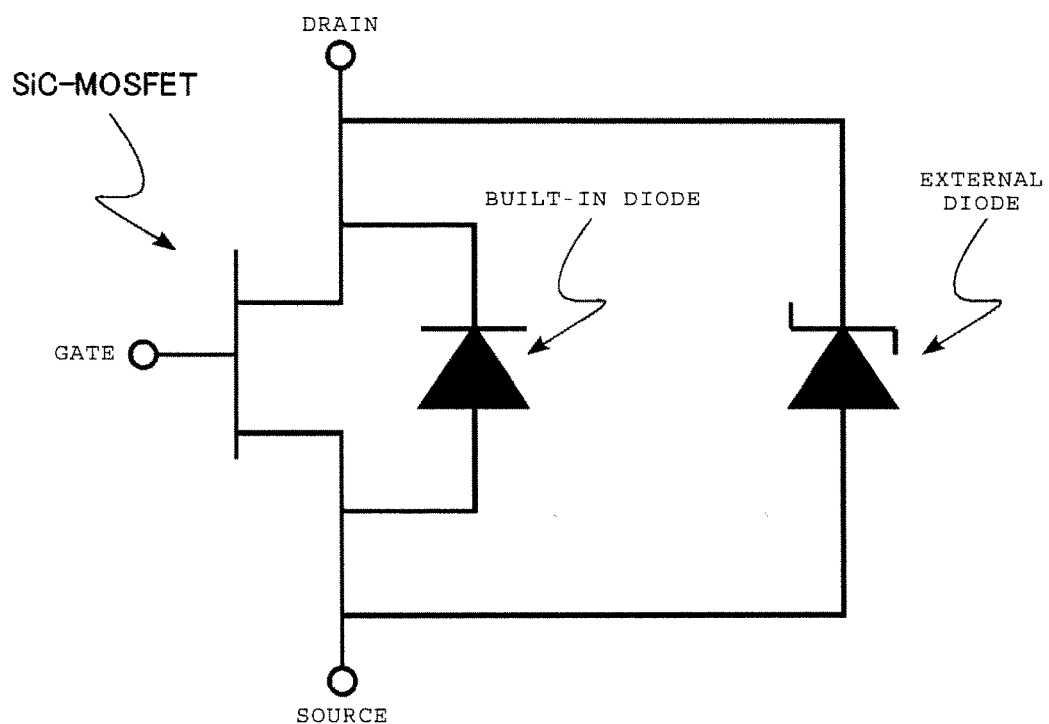
FIG. 4 is an explanatory view of an operation and an effect of the semiconductor device according to the first embodiment.

Still another method of solving the problem related to the conduction deterioration of the built-in diode, as illustrated in FIG. 4, is connecting an external diode between a drain and a source of an SiC-MOSFET in parallel with the SiC-MOSFET.

For example, as the external diode, a Schottky barrier diode (SBD) formed from SiC is used. An on-state voltage of a pn junction diode formed from SiC is approximately 2.5 V, and an on-state voltage of the Schottky barrier diode is as low as approximately 1 V. According to this, a reverse conduction current mainly flows through the external SBD. In this circuit, when a current flowing to the built-in diode is suppressed, injection of a hole to the drift region 26 is suppressed, and thus it is possible to prevent the stacking defect from expanding.

However, so as to sufficiently suppress a current that flows to the built-in diode, a chip area of the external SBD is increased, and thus there is a concern that the cost may further increase in comparison to a case of using the SiC-MOSFET alone. In addition, since the chip area of the external SBD increases, there is a concern that a switching loss may increase.

The MOSFET 100 according to the first example embodiment is provided with an SBD cell, which allows a reverse current to flow, integrated in the same chip as that of the SiC-MOSFET. Hereinafter, description will be given of an operation of the MOSFET 100 according to this embodiment.

The anode electrode 16 according to this embodiment is p-type polycrystal silicon. An initial voltage of a heterojunction diode of the p-type polycrystal silicon and the n⁻-type drift region 26 is approximately 1.2 V. In contrast, an initial voltage of a pn junction diode of the p-type base region 28 and the n⁻-type drift region 26 is approximately 2.5 V.

Both an anode electric potential of the hetero-junction diode and an anode electric potential of the pn junction diode are connected to the source electrode 12, and become substantially equal to each other. Accordingly, when a current is allowed to flow in a reverse conduction direction, a current starts to flow from the hetero-junction diode of the SBD cell in which the initial voltage is small.

The hetero-junction diode is a unipolar device in which an electron is set as a sole carrier. Accordingly, even when the reverse conduction current flows to the hetero-junction diode, growth and expansion of the stacking defect caused by recoupling energy of the carrier does not occur, in contrast to what might occur with use of a pn junction diode, which is a bipolar device.

Figure 5:
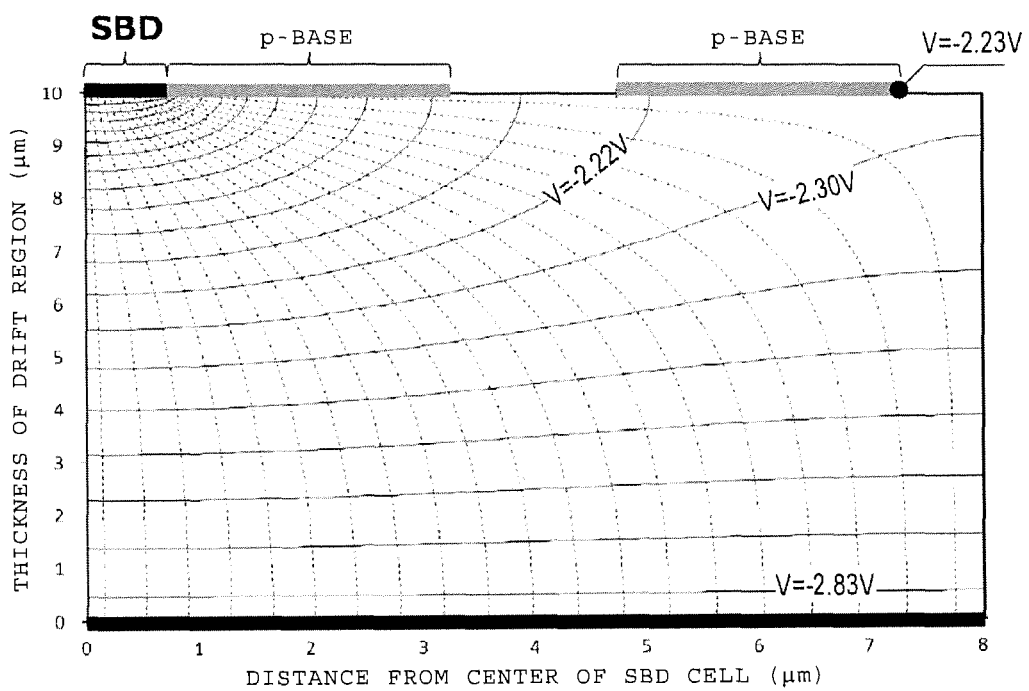
FIG. 5 is an explanatory view of an operation and an effect of the semiconductor device according to the first embodiment.

FIG. 5 is a view illustrating a simulation result of a current distribution and a voltage distribution in the reverse conduction state of the MOSFET 100 according to this embodiment. In a structure of the MOSFET which is assumed in the simulation, one SBD cell is arranged with respect to three MOSFET cells. In each of the cells, a length (long side) in a first direction is approximately 1.6 mm, and a length (short side) in a second direction is approximately 4 μm. A width of the base region 28 in the second direction is approximately 2.5 μm, and an interval between a plurality of the base regions 28 in the second direction is approximately 1.5 μm. For example, 1360 cells are arranged to configure a chip of 6×6 mm². For example, a rated current of the chip in a forward direction is 120 amperes (A).

FIG. 5 illustrates a current distribution and a voltage distribution in a region which is surrounded by the dotted line in FIG. 1 and in which the length in the second direction is approximately 8 μm. FIG. 5 illustrates a current distribution and a voltage distribution in the drift region 26 when a reverse current of 120 A, which is the same as the rated current, flows to the chip.

In FIG. 5, a reference for an electric potential is set to the source electrode 12. Accordingly, an electric potential in the drift region 26 takes a negative value. An electric potential immediately below the SBD is set as −1.2 V that is the same as an initial voltage of the SBD.

On the other hand, a voltage of the drift region 26 that is in contact with the base region 28 is at a minimum at a point spaced away from the center of the SBD by 7.25 μm, and the minimum value is −2.23 V. Accordingly, the minimum value does not exceed the initial voltage (−2.5 V) of the pn junction diode, and thus the entirety of the current flows through the SBD. Accordingly, a hole from the base region 28 is not injected to the drift region 26.

In addition, when a current increases, and a reverse current reaches 150 A, an electric potential of the n-type drift region 26 that is in contact with the base region 28 exceeds an initial voltage of 2.5 V of the pn junction, and thus a current flows to the pn junction.

Figure 6:
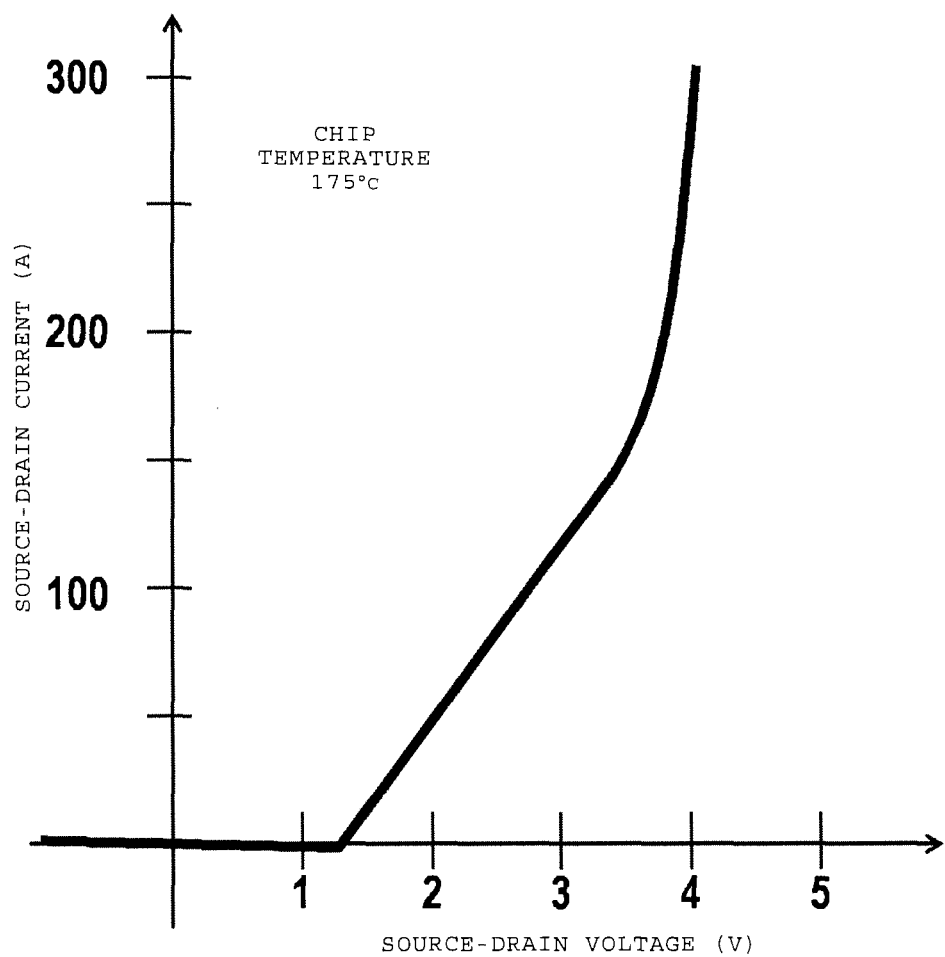
FIG. 6 is an explanatory view of an operation and an effect of the semiconductor device according to the first embodiment.
Figure 7A:
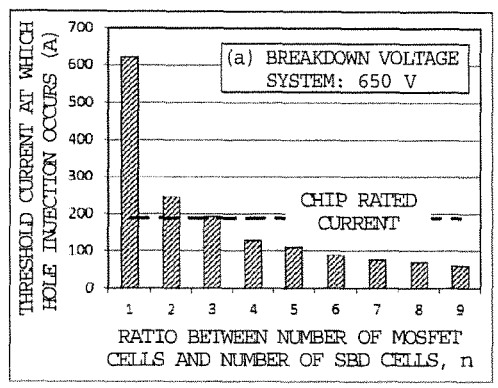
FIG. 7A, FIG. 7B, FIG. 7C, and FIG. 7D show explanatory views of an operation and an effect of the semiconductor device according to the first embodiment.
Figure 7B:
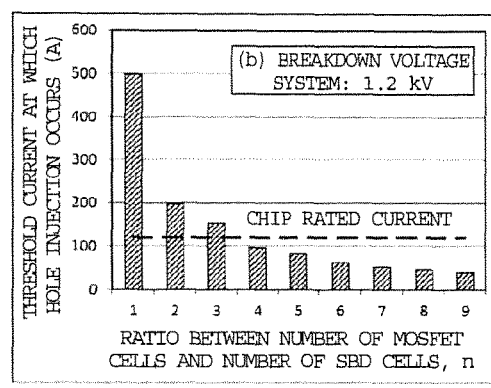
Figure 7C:
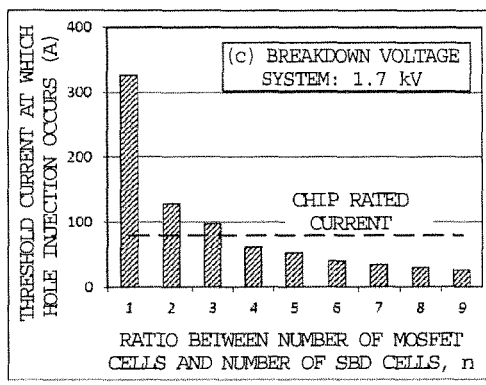
Figure 7D:
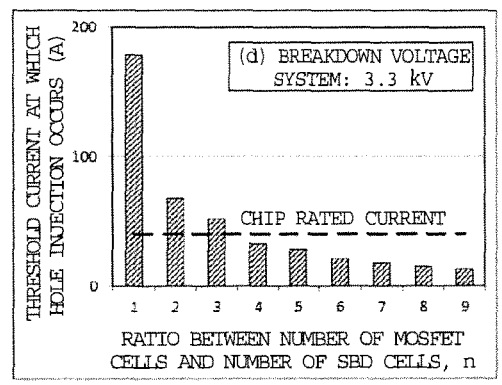

FIG. 6 illustrates reverse current-voltage characteristics of the SiC-MOSFET that includes the MOSFET cell and the SBD cell and has a chip size of 6×6 mm² at 175° C. A rated current of the MOSFET is 120 A.

A reverse current exhibits the following phenomenon. Specifically, the reverse current rises when a source-drain voltage exceeds 1.2 V. In addition, when a current reaches 150 A, the reverse current is inflected and the current rapidly increases. An electric potential at an inflection point is 3.4 V.

When the source-drain voltage becomes equal to or greater than 3.4 V, a current flows to the pn junction of the built-in diode. According to this, resistance of the drift region 26 decreases due to conductivity modulation, and thus a current rapidly increases.

In the MOSFET 100 according to this embodiment, even when a voltage, which greatly exceeds the initial voltage of 2.5 V of the built-in diode in the MOSFET cell, is applied between the source electrode 12 and the drain electrode 14, a current does not flow to the pn junction of the built-in diode due to an effect of the SBD cell that is connected in parallel to the MOSFET cell. In other words, in a range that is equal to or lower than the rated current of the MOSFET 100, a current is suppressed from flowing to the pn junction of the built-in diode. Accordingly, the conduction deterioration is suppressed. As a result, reliability of the MOSFET 100 is improved.

In addition, in this embodiment, one SBD cell is provided with respect to three MOSFET cells. According to this, when the SBD cell is provided, a percent increase of the chip area is as small as approximately 30%. Accordingly, an increase in the manufacturing cost of the MOSFET 100 is suppressed.

In addition, in comparison to a process of manufacturing another MOSFET, in the MOSFET 100 according to this embodiment, a process of forming an opening in the gate insulating film 20 for formation of the anode electrode 16 is added. Accordingly, from this point, an increase in the manufacturing cost of the MOSFET 100 is suppressed.

In addition, in the MOSFET 100 according to this embodiment, the SBD cell and the MOSFET cell have substantially the same cell size. In addition, the entirety of the base regions 28 can be arranged in substantially the same period. Accordingly, processing during lithography or etching becomes stable, and thus it is possible to achieve the MOSFET 100 that is appropriate for miniaturization.

In addition, in the MOSFET 100 according to this embodiment, the contact region 32, which is connected to the source electrode 12 with low resistance, is provided to each of the base regions 28. According to this, even when a voltage applied to the MOSFET 100 increases, and a hole flows to the base region 28 during avalanche breakdown, an increase in an electric potential of the base region 28 is suppressed. Accordingly, it is possible to prevent secondary breakdown from occurring, and thus it is possible to achieve the MOSFET 100 that is excellent in avalanche resistance.

In addition, in the MOSFET 100 according to this embodiment, when a drain-to-source voltage increases, a density of electric force line from the $n^+$-type drain region 24 to the anode electrode 16 of the SBD cell also increases. However, when a voltage of several volts or greater is applied, a width of a depletion layer, which extends from the base region 28 to the drift region 26, reaches an interval distance between the base regions 28, for example, approximately 1.5 µm, and thus a termination destination of the electric force line faces the base region 28. As a result, an increase in electric field strength on a lower side of the anode electrode 16 of the SBD cell becomes moderate, and thus even when a high voltage is applied between a drain and a source, an increase in a leakage current of an SBD cell region is suppressed.

In addition, in the MOSFET 100 according to this embodiment, when a very large surge current greatly larger than a rated current is input in a reverse conduction direction, as illustrated in FIG. 6, a hole from the base region 28 is suppressed from being injected to the drift region 26. Accordingly, an electric potential drop of the drift region 26 is suppressed due to conductivity modulation, and thus occurrence of thermal breakdown of the MOSFET 100 is suppressed. As a result, it is possible to achieve the MOSFET 100 of which reverse surge current resistance is great.

Furthermore, even when a hole is injected to the drift region 26 from the base region 28 during application of a surge current, the injection does not occur for a long period of time. Accordingly, an increase in on-state resistance due to an increase in the stacking defect does not occur.

In the MOSFET 100 according to this embodiment, it is possible to allow a reverse current, which is substantially the same as a rated current, to flow to the SBD cell. At this time, an electric potential drop between a source and a drain is as large as 3.4 V, and a heat generation density also increases. Accordingly, it is desired to mitigate the flow of the reverse current to the SBD for a long period time from the viewpoint of an increase in an element temperature.

With regard to this problem, when a gate of the MOSFET 100 is turned on for a reverse conduction period, it is possible to suppress the electric potential drop between a source and a drain. In the MOSFET 100 according to this embodiment, when the element temperature is 175° C., a source-drain voltage when allowing a rated current to flow is 1.7 V. As a result, it is possible to reduce the heat generation density to 43%.

That is, in the MOSFET 100 according to this embodiment, a current flows to the SBD cell momentarily when a gate is turned off and a current direction is switched from a state in which a constant load current flows from the drain electrode 14 to the source electrode 12, similar to an inductive load when a gate is turned on. In addition, after the current direction is switched, the gate is turned on again to allow a reverse current to flow to the MOSFET cell. When the synchronous rectification mode is applied, it is also possible to suppress heat generation of an element, and thus an operation with high reliability becomes possible.

Next, consideration will be given of an appropriate ratio between the MOSFET cell and the SBD cell. In other words, consideration will be given of an appropriate number n of the gate electrodes 18 each being provided between adjacent two anode electrodes 16.

First, Table 1 illustrates representative design parameters of a drift layer in a breakdown voltage system from 650 V to 3.3 kV to which the SiC-MOSFET can be applied.

TABLE 1

| Breakdown voltage system | | 650 V | 1.2 kV | 1.7 kV | 3.3 kV |
|---|---|---|---|---|---|
| Drift layer structure | Resistivity (Ωcm)* | 1.8 | 2.2 | 3.5 | 6.7 |
| | Thickness (µm) | 5 | 10 | 15 | 30 |
| | Resistance (mΩ · cm$^2$) | 0.91 | 2.2 | 5.2 | 20 |
| Heat generation density (W/cm$^2$) | | 360 | 360 | 360 | 360 |
| Current density (A/cm$^2$) | | 520 | 330 | 220 | 110 |
| Rated current per chip (A)** | | 190 | 120 | 80 | 40 |

*Chip temperature is assumed to be 175° C.
**Chip size is assumed to be 6 × 6 mm$^2$ A rated current is determined in total consideration of heat resistance, reliability, and the like of an element. In Table 1, a rated current of a chip having a size of 6×6 mm$^2$ is described on the assumption that a heat generation density of the drift region 26 is 360 W/cm$^2$ or less.

Here, an effective area ratio of the drift region 26 to the entire area of a chip is 83%. A rated current density Jo illustrated in Table 1 may be approximately expressed as the following Expression (1) based on a chip area.

[Expression 1]

$$J_0 = 356/BV \text{ (A/cm}^2\text{)} \quad \text{(Expression 1)}$$

Here, BV represents a breakdown voltage system in a unit of kV. Furthermore, in the trial calculation, an element temperature is set as 175° C.

FIGS. 7A to 7D illustrate results obtained by calculating a threshold current, at which a current does not flow to a pn junction of a built-in diode of the MOSFET, as a function of n. Element parameters of respective breakdown voltage systems illustrated in Table 1 are used. In addition, in a structure illustrated in FIG. 1, a threshold current is calculated on the assumption that one anode electrode 16 of the SBD cell having a width of approximately 4 µm is arranged with respect to n gate electrodes 18 of the MOSFET cell having a width of approximately 4 µm.

When n is 1, that is, the MOSFET and the SBD are arranged in a ratio of 1:1, a threshold current at which the pn junction operates greatly increases. However, a rated current is excessive, and thus it can be seen that this configuration may not be desirable from the viewpoint of an increase in the manufacturing cost and an increase in a switching loss.

Setting of the rated current and setting of a finger region size (a finger region is described further below in reference to a third embodiment) may vary in accordance with individual design conditions, but it is generally considered that a range from approximately 50% below to approximately 50% above of a value given by Expression (1) for a rated current density is practical. Accordingly, from the results illustrated in FIGS. 7A to 7D, n is set as 2 to 5.

When n is less the above-described range, the manufacturing cost and the switching loss may increase. In addition, when n is greater than the above-described range, conduction deterioration may occur.

As described above, according to this embodiment, it is possible to achieve the MOSFET 100 of which reliability can be improved by suppressing conduction deterioration.

Second Embodiment

A semiconductor device according to a second example embodiment is different from the first embodiment in some respects, such as in that the first conductive layer is a portion of the first electrode. Hereinafter, description of components similarly configured as those in the first embodiment will be omitted.

Figure 8:
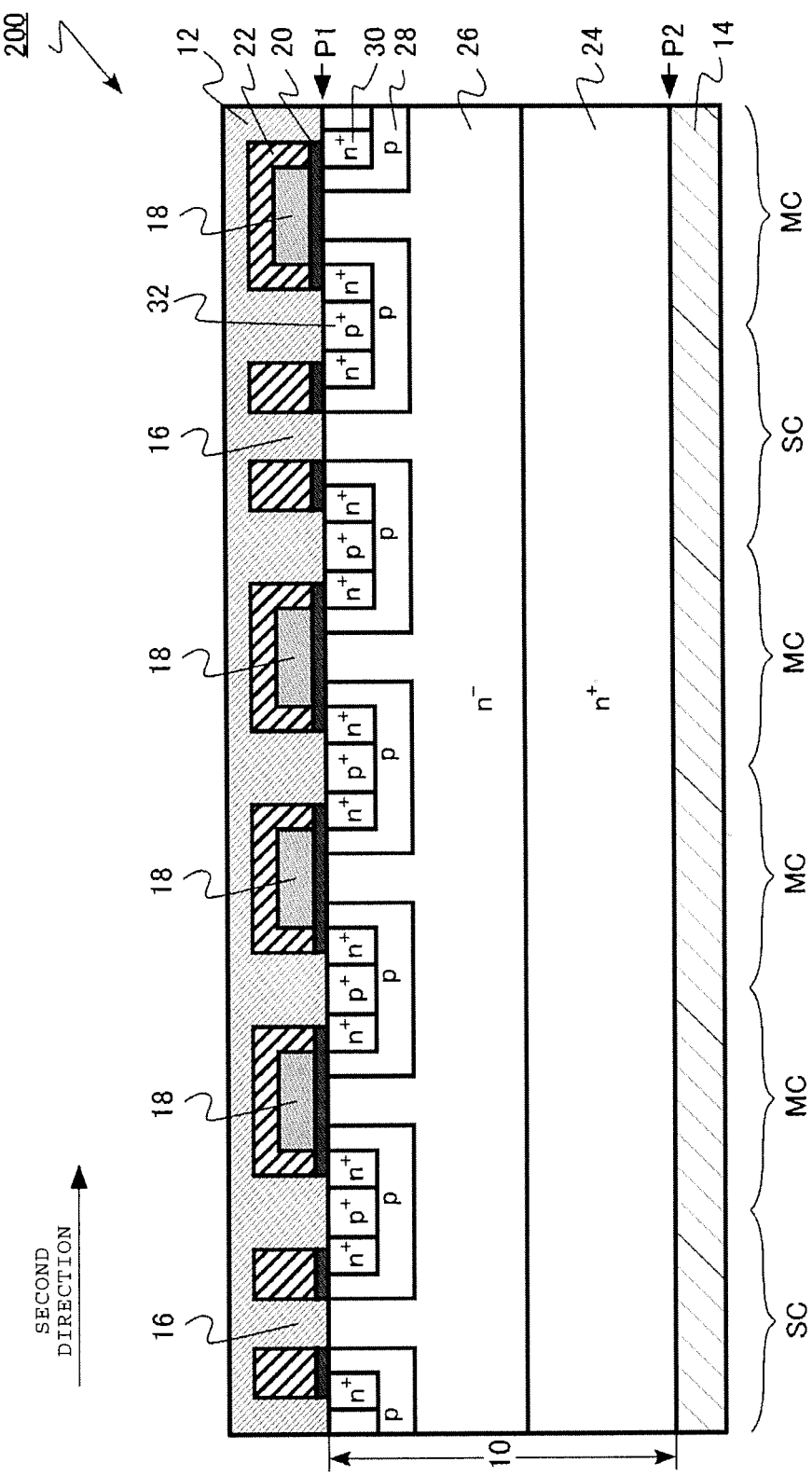
FIG. 8 is an explanatory view of an operation and an effect of the semiconductor device according to the first embodiment.

FIG. 8 is a schematic cross-sectional view of the semiconductor device according to this embodiment. The semiconductor device according to this embodiment is n-type vertical MOSFET 200 which uses silicon carbide and in which an electron is set as a carrier.

Figure 9:
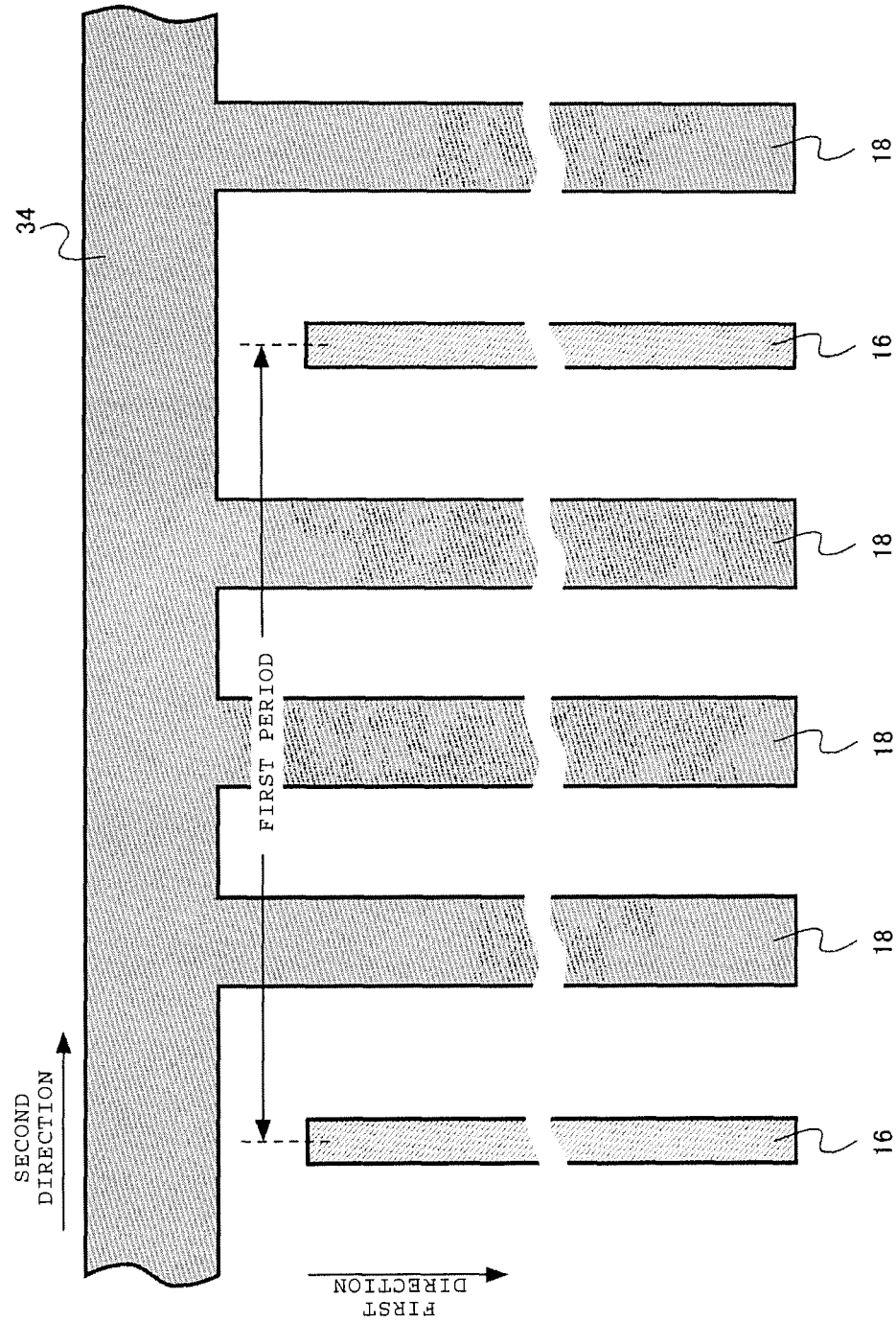
FIG. 9 is a schematic cross-sectional view of a semiconductor device according to a second embodiment.

FIG. 9 is a schematic plan view of the semiconductor device according to this embodiment. FIG. 9 illustrates an arrangement of the anode electrode 16 and the gate electrode 18.

The anode electrode 16 is provided to be in contact with the drift region 26 between two adjacent base regions 28 among the plurality of base regions 28. The anode electrode 16 extends in the first direction as illustrated in FIG. 9. The anode electrode 16 is repetitively provided in the first period in the second direction that is perpendicular to the first direction.

The anode electrode 16 is a portion of the source electrode 12. Accordingly, the anode electrode 16 is formed from the same material as that of the source electrode 12.

The anode electrode 16 contains a metal. The metal, which is included in the anode electrode 16, has a stacked structure of, for example, titanium (Ti) and aluminum (Al). A junction between the anode electrode 16 and the drift region 26 is a Schottky junction.

The anode electrode 16 according to this embodiment is formed simultaneously with the source electrode 12. The anode electrode 16 can be formed in a single formation process with the source electrode 12. For example, in the region in which the anode electrode 16 is formed, a material of the gate electrode 18 is removed during formation of the gate electrode 18. In addition, a contact hole for the anode electrode 16 is also formed during formation of a contact hole of the source electrode 12.

As described, according to this embodiment, it is possible to achieve the MOSFET 200 in which reliability can be improved by suppressing conduction deterioration.

Third Embodiment

A semiconductor device according to a third example embodiment includes the components included in the semiconductor device of the first embodiment, and further includes: a third electrode that is electrically connected to the first electrode; a plurality of p-type fifth silicon carbide regions which are provided in the silicon carbide layer and between the n-type first silicon carbide region and the third electrode, and extend in the first direction; a plurality of n-type sixth silicon carbide regions each of which is provided in the silicon carbide layer and between each of the p-type fifth silicon carbide regions and the third electrode, has an n-type impurity concentration higher than an n-type impurity concentration of the n-type first silicon carbide region, and is electrically connected to the third electrode; a plurality of second conductive layers each of which is in contact with the n-type first silicon carbide region that is provided between two adjacent p-type fifth silicon carbide regions among the plurality of p-type fifth silicon carbide regions, extends in the first direction, is provided in the first period, and is electrically connected to the third electrode; n (n=2, 3, 4, or 5) second gate electrodes that are provided between two adjacent second conductive layers among the plurality of second conductive layers, and extend in the first direction; a plurality of second gate insulating layers each of which is provided between each of the n second gate electrodes and the n-type first silicon carbide region; a gate layer that is provided between the n first gate electrodes and the n second gate electrodes, is connected to ends of the n first gate electrodes and ends of the n second gate electrodes, and is wider than the n first gate electrodes and the n second gate electrodes; an insulating layer that is provided between the gate layer and the n-type first silicon carbide region, and is thicker than the first gate insulating layer and the second gate insulating layer; and a p-type seventh silicon carbide region that is provided in the silicon carbide layer and between the n-type first silicon carbide region and the insulating layer, is connected to the p-type second silicon carbide regions which are provided between the two adjacent first conductive layers, and is connected to the p-type fifth silicon carbide regions that are provided between the two adjacent second conductive layers. In addition, a distance between an arbitrary position of the p-type seventh silicon carbide region and a portion at which any one of the two adjacent first conductive layers and the n-type first silicon carbide region are in contact with each other, or a distance between a portion at which any one of the two adjacent second conductive layers and the n-type first silicon carbide region are in contact with each other is less than a half of 6/(n+1) times of the first period. Particularly, in this embodiment, the distance between an arbitrary position of the p-type seventh silicon carbide region and a portion at which any one of the two adjacent first conductive layers and the n-type first silicon carbide region are in contact with each other, or the distance a portion at which any one of the two adjacent second conductive layers and the n-type first silicon carbide region are in contact with each other is less than a half of the first period. Hereinafter, description of components similarly configured as those in the first embodiment will be omitted.

Figure 10:
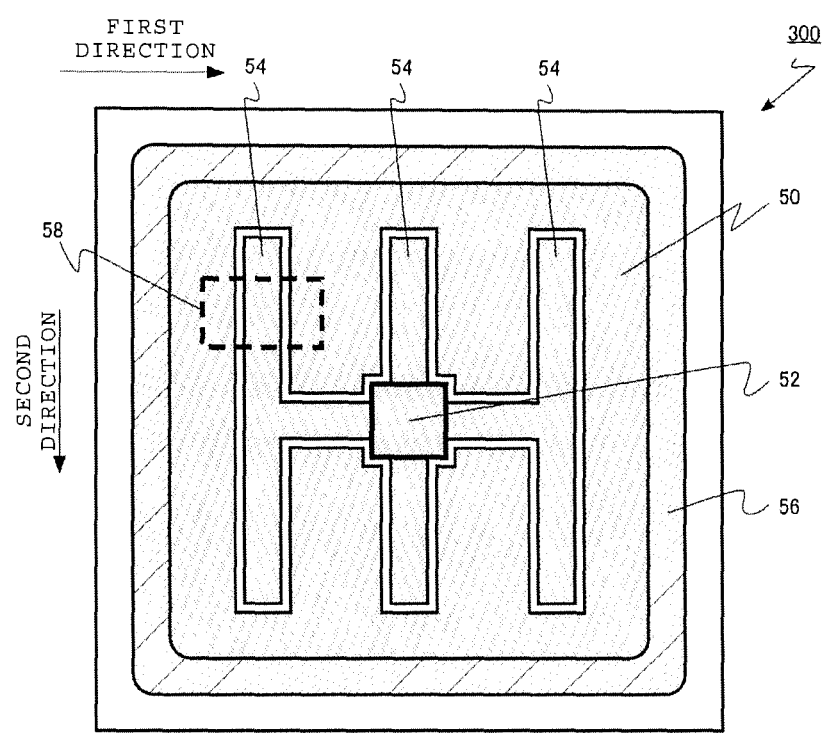
FIG. 10 is a schematic plan view of a semiconductor device according to a third embodiment.

FIG. 10 is a schematic plan view of the semiconductor device according to this embodiment. The semiconductor device according to this embodiment is an n-type vertical MOSFET 300 which uses silicon carbide and in which an electron is set as a carrier. FIG. 10 is a view illustrating the entirety of a chip of the MOSFET 300.

The MOSFET 300 includes a main region 50, a gate pad region 52, a gate finger region 54, and a termination region 56.

The main region 50 is a region in which a MOSFET cell and an SBD cell are arranged. The gate pad region 52 is a region to which a gate voltage signal to be applied to a gate electrode of the MOSFET cell is applied. The gate finger region 54 is a region that transmits the gate voltage signal to gate electrodes of the entirety of MOSFET cells of the chip. The termination region 56 is a region that suppresses electric field concentration at an end of the main region 50. The gate pad region 52, the gate finger region 54, and the termination region 56 are supplementary regions.

Figure 11:
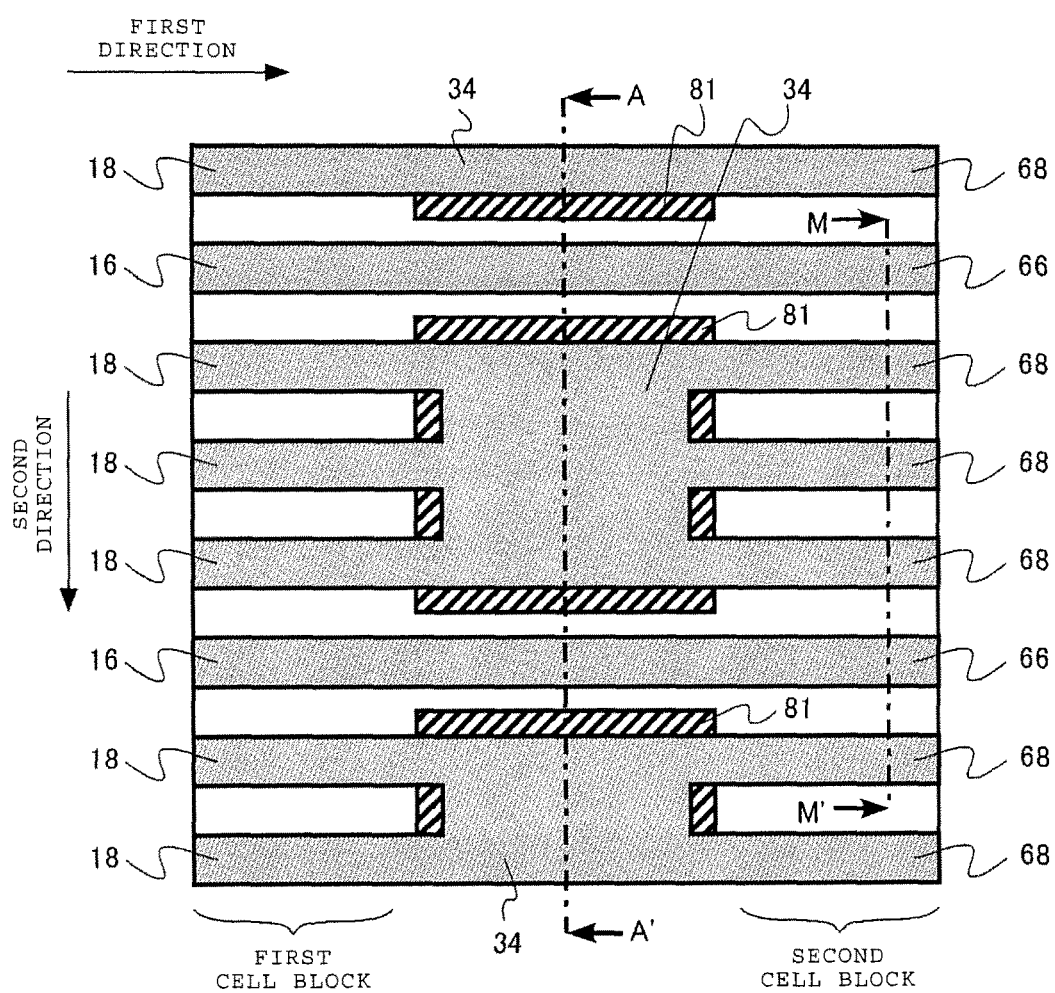
FIG. 11 is a schematic plan view of a gate finger region according to the third embodiment.

FIG. 11 is a schematic plan view of the gate finger region 54 according to this embodiment. FIG. 11 is an enlarged view of a portion indicated by a dotted line 58 in FIG. 10. FIG. 11 illustrates patterns of a field oxide film, an anode electrode, a gate electrode, and a gate connection layer in the gate finger region 54.

The gate finger region 54 includes a first cell block and a second cell block with a gate connection layer (gate layer) 34 interposed therebetween. For example, the first cell block has a structure similar to the structure illustrated in FIG. 1 in the first embodiment.

Figure 12:
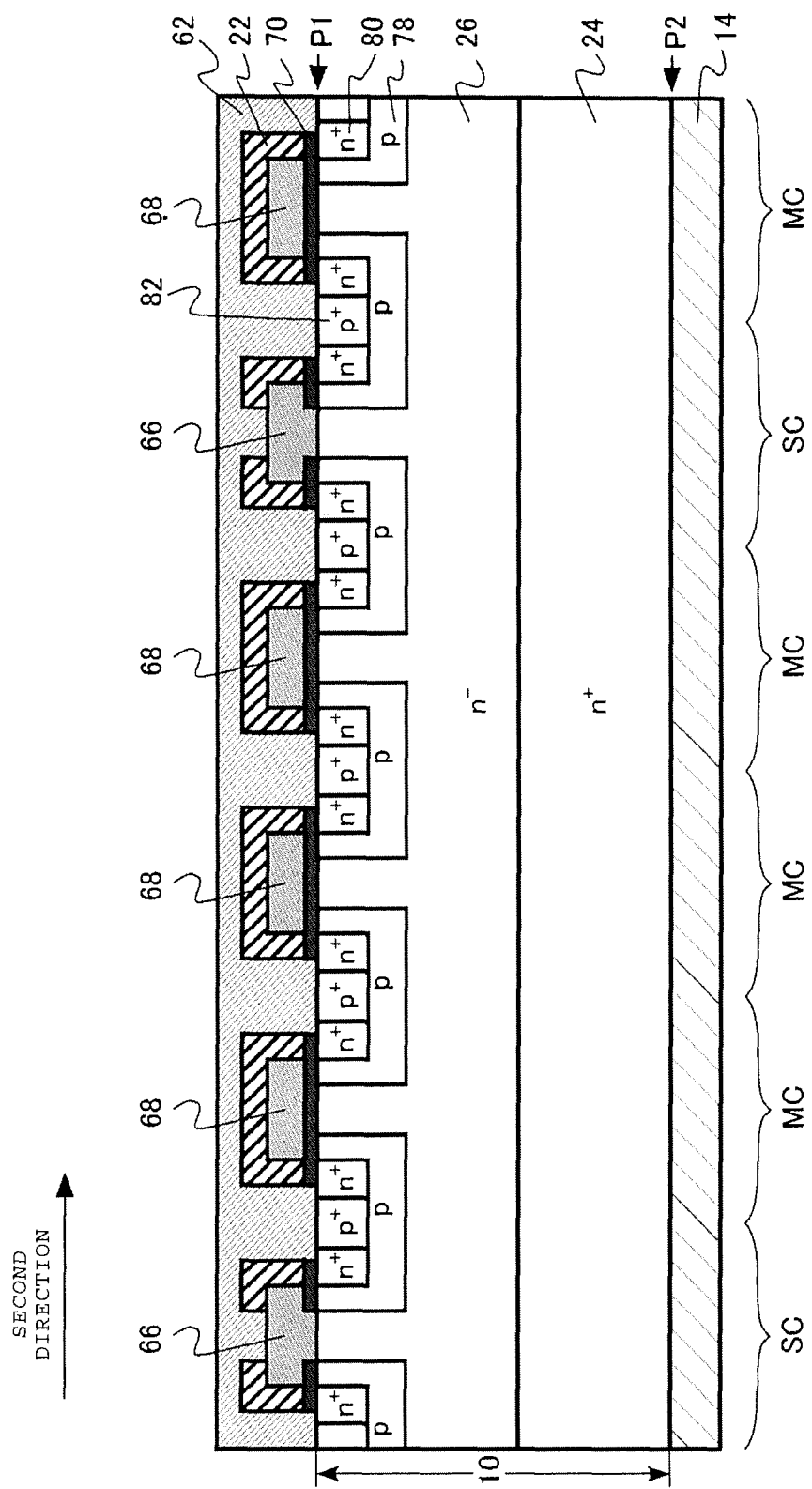
FIG. 12 is a schematic cross-sectional view of the semiconductor device according to the third embodiment.

FIG. 12 is a schematic cross-sectional view of the semiconductor device according to this embodiment. FIG. 12 is a cross-sectional view taken along line M-M' in FIG. 11. FIG. 12 is a schematic cross-sectional view of the second cell block. The second cell block has a structure similar to that of the first cell block.

The second cell block includes an MOSFET cell (MC) and an SBD cell (SC) which are regularly arranged. Hereinafter, description will be given for a case where n is set as 3 as an example.

The second cell block includes the silicon carbide layer 10, a source electrode (third electrode) 62, the drain electrode (second electrode) 14, an anode electrode (second conductive layer) 66, an SBD region 67 (see FIG. 13), a gate electrode (second gate electrode) 68, a gate insulating film (second gate insulating layer) 70, the interlayer insulating film 22, and the gate connection layer (gate layer) 34.

The n$^+$-type drain region 24, the n$^-$-type drift region (n-type first silicon carbide region) 26, a p-type base region (p-type fifth silicon carbide region) 78, an n$^+$-type source region (n-type sixth silicon carbide region) 80, and a p$^+$-type contact region 82 are provided in the silicon carbide layer 10.

The gate connection layer 34 is provided between three gate electrodes 18 and three gate electrodes 68. Ends of the three gate electrodes 18 are connected to the gate connection layer 34. In addition, ends of the three gate electrodes 68 are connected to the gate connection layer 34. The gate connection layer 34 is divided into portions in the second direction.

For example, the gate connection layer 34 is p-type polycrystal silicon that contains a p-type impurity. The gate connection layer 34 can be formed from the same material as that of the gate electrodes 18 and 68. The gate connection layer 34 can be formed simultaneously with the gate electrodes 18 and 68. The gate connection layer 34 can be formed in a same formation process as the gate electrodes 18 and 68. The gate connection layer 34 is wider (e.g., along the second direction) than the gate electrode 18 and the gate electrode 68.

A field oxide film (insulating layer) 81 is provided between the gate connection layer 34 and the drift region 26. The field oxide film 81 is divided into portions in the second direction.

The field oxide film 81 (see FIG. 11) is thicker than the gate insulating films 20 and 70. For example, the field oxide film 81 is a silicon oxide film.

The anode electrode 16 and the anode electrode 66 are connected to each other. The field oxide film 81 is not provided between the anode electrodes 16 and 66, and the drift region 26.

Figure 13:
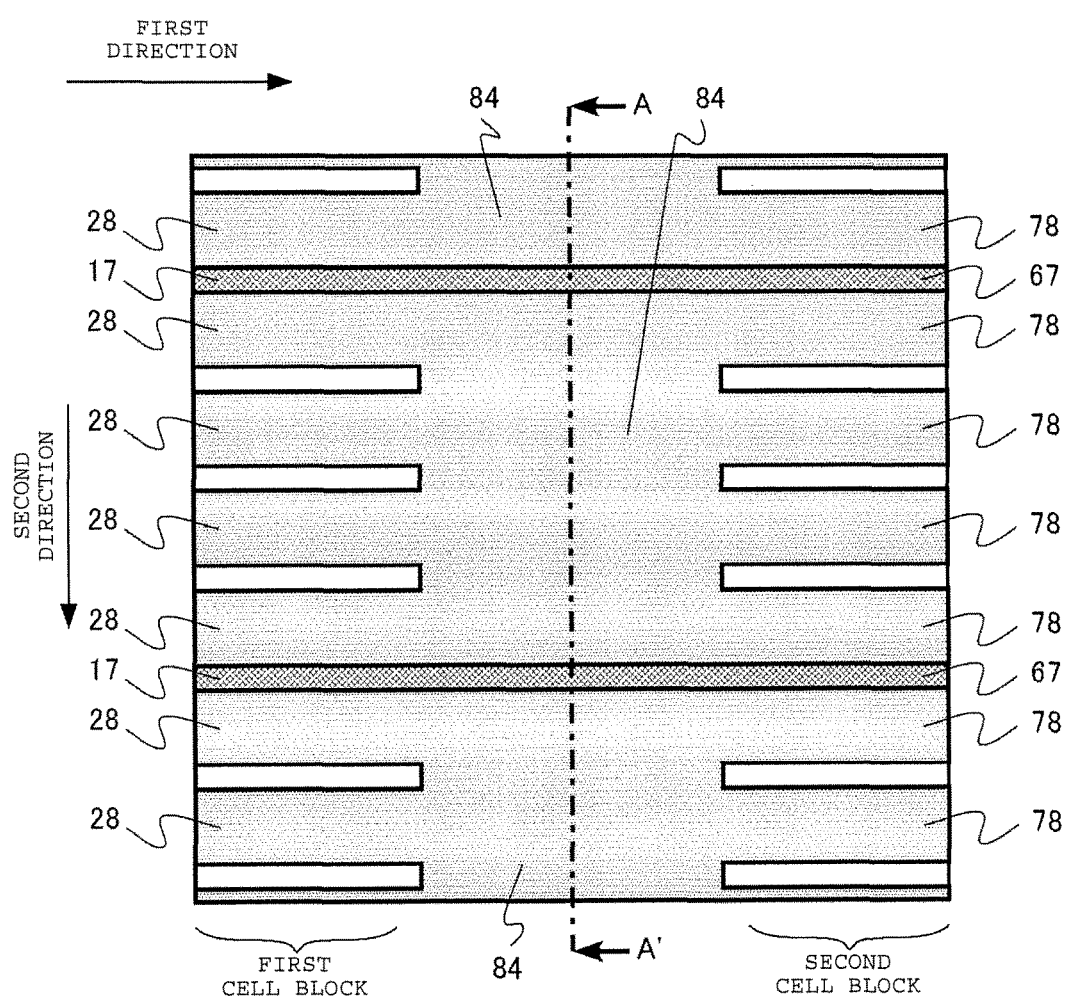
FIG. 13 is a schematic plan view of the gate finger region according to the third embodiment.

FIG. 13 is a schematic plan view of the gate finger region according to this embodiment. FIG. 13 illustrates the same region as in FIG. 11. FIG. 13 illustrates patterns of the p-type silicon carbide region and the SBD region in the gate finger region 54.

The MOSFET 300 includes a p-type region (p-type seventh silicon carbide region) 84. The p-type region 84 is provided in the silicon carbide layer 10. The p-type region 84 is provided between the drift region 26 and the field oxide film 81.

The p-type region 84 is connected to four base regions 28, which are provided between two adjacent anode electrodes 16 among a plurality of the anode electrodes 16. A plurality of the above-described arrangements can be provided. In addition, the p-type region 84 is connected to four base regions 78, which are provided between two adjacent anode electrodes 66 among a plurality of the anode electrodes 66. A plurality of the above-described arrangements can be provided.

The p-type region 84 has approximately the same p-type impurity concentration and the same depth as those of the base regions 28 and the base regions 78. The p-type region 84 can be formed simultaneously with the base regions 28 and the base regions 78. The p-type region 84, the base regions 28 and the base regions 78 can be formed in a single formation process.

The p-type region 84 is divided into portions arrayed in the second direction. The SBD region 17 and the SBD region 67 are connected to each other and are located between the divided portions of the p-type region 84.

A distance between an arbitrary position of the p-type region 84 and a portion at which any one of the two adjacent anode electrodes 16 and the drift region 26 are in contact with each other, or a distance between a portion at which any one of the adjacent anode electrodes 66 and the drift region 26 are in contact with each other is less than a half of 6/(n+1) times the first period. In other words, a distance of an arbitrary position of the p-type region 84 and the SBD region 17 or the SBD region 67 is less than a half of 6/(n+1) times the first period. For example, when n is set as 3, a distance between an arbitrary position of the p-type region 84 and the SBD region 17 or the SBD region 67 is less than a half of 3/2 times the first period.

It is desirable that the distance between an arbitrary position of the p-type region 84 and the SBD region 17 or the SBD region 67 is less than a half of the first period.

Figure 14:
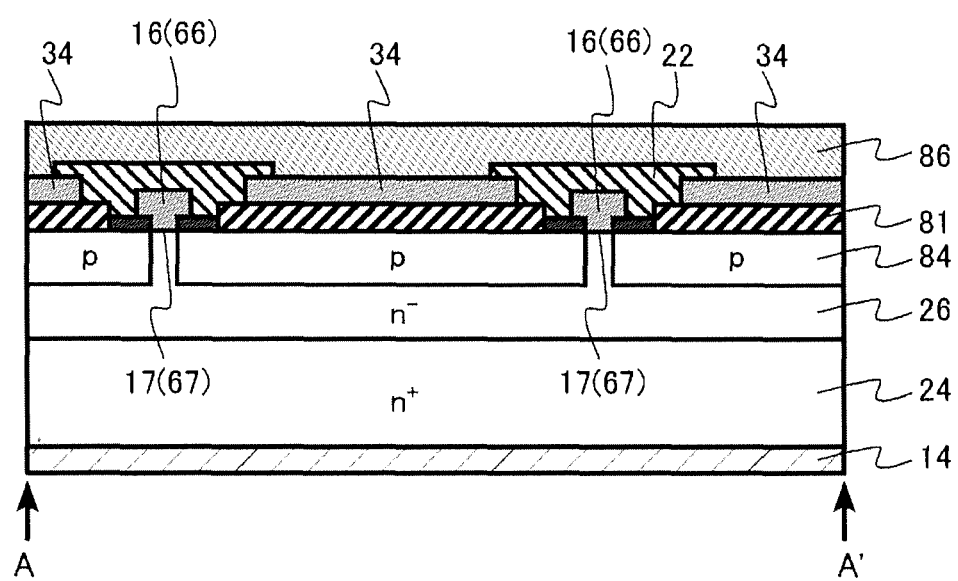
FIG. 14 is a schematic cross-sectional view of the gate finger region according to the third embodiment.

FIG. 14 is a schematic cross-sectional view of the gate finger region 54 according to this embodiment. FIG. 14 is a cross-sectional view taken along line A-A' in FIG. 11 and FIG. 13.

Portions of the gate connection layer 34 divided in the second direction are electrically connected to each other by a gate metal wiring 86. For example, the gate metal wiring 86 is formed from the same material as that of the source electrodes 12 and 62. For example, the gate metal wiring 86 is formed simultaneously with the source electrodes 12 and 62. For example, the gate metal wiring 86 is formed in a single formation process with the source electrodes 12 and 62.

Next, description will be given of an operation and an effect of this embodiment. FIG. 15 to FIG. 20 are explanatory views of the operation and the effect of this embodiment.

First, description will be given of a structure and a function of the gate finger region with reference to the MOSFET 900, which is not provided with the SBD cell, such as the MOSFET 900 depicted in FIG. 3.

Figure 15:
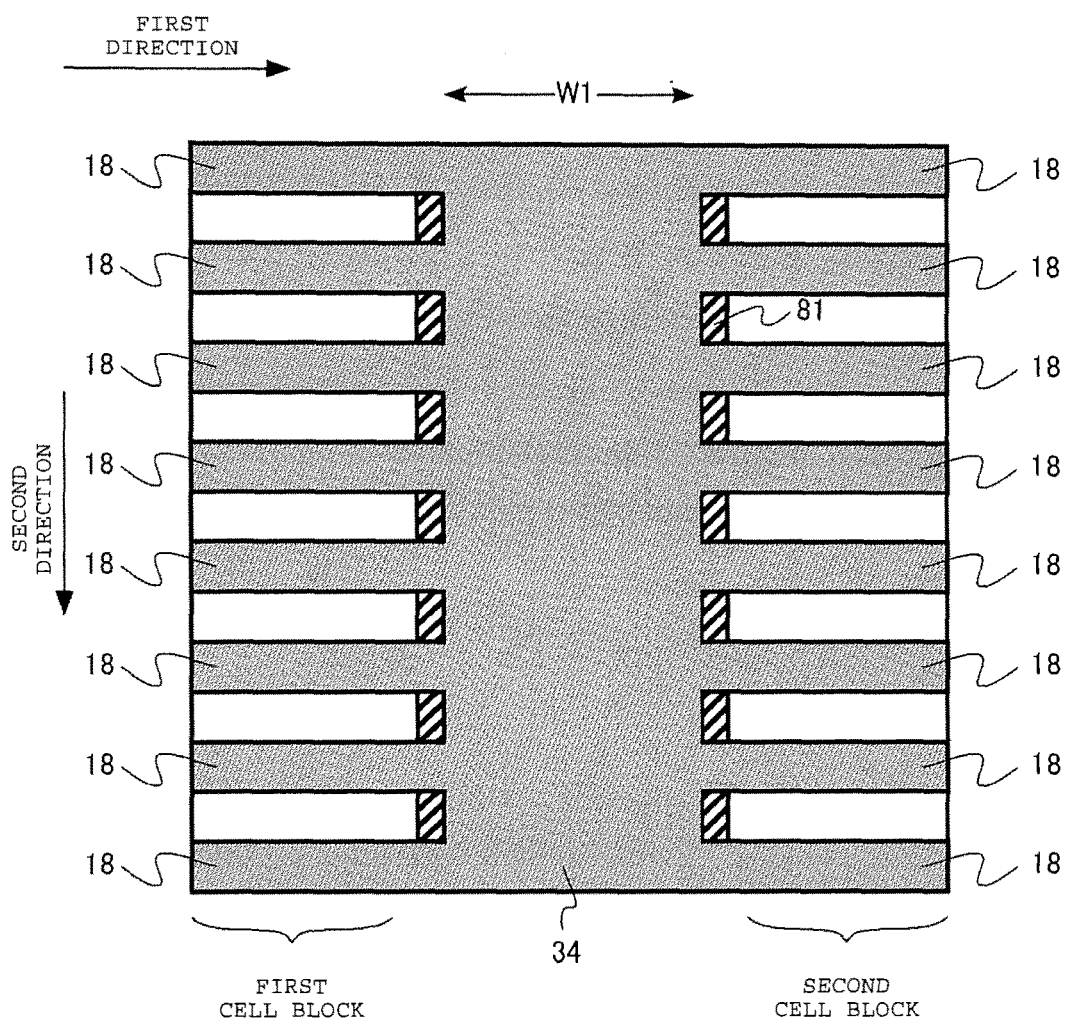
FIG. 15 is an explanatory view of an operation and an effect of the semiconductor device according to the third embodiment.
Figure 16:
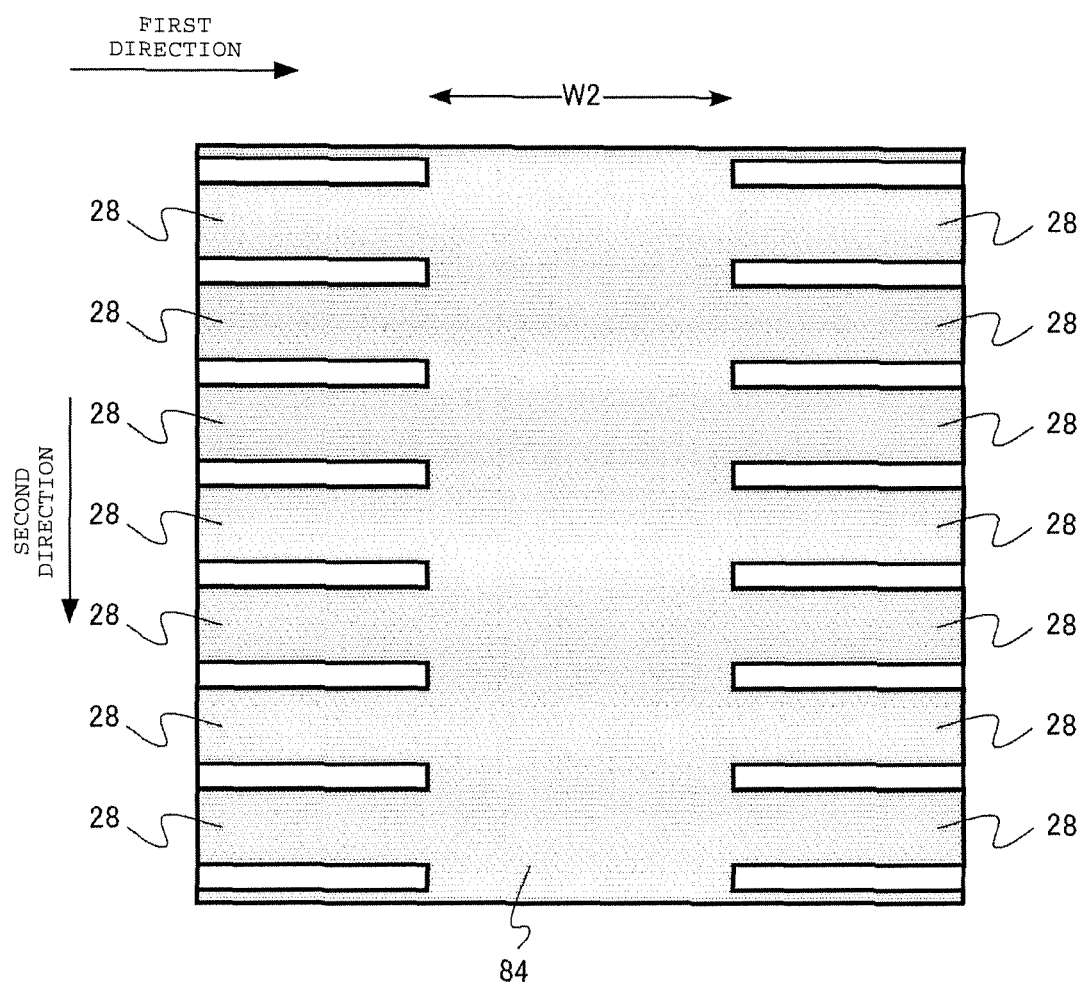
FIG. 16 is an explanatory view of an operation and an effect of the semiconductor device according to the third embodiment.

FIG. 15 and FIG. 16 are schematic plan views of the gate finger region when the SBD cell is not provided. FIG. 15 illustrates patterns of the field oxide film, the anode electrode, the gate electrode, and the gate connection layer in the gate finger region. FIG. 16 illustrates a pattern of the p-type silicon carbide region in the gate finger region.

In the gate finger region, a first cell block and a second cell block are provided with the gate connection layer (gate layer) 34 interposed therebetween. For example, the first cell block and the second cell block have a structure, which does not include the SBD cell, similar to the structure illustrated in FIG. 3.

The gate finger region has a structure in which a low-resistance metal electrode (not illustrated) is arranged on the gate connection layer 34. Typically, surface resistance of the gate connection layer 34, which is formed from the same material as that of the gate electrode 18, is as great as several tens of ohms square. According to this, it is difficult to transmit a gate signal from the gate electrode 18 to the entirety of a chip at a high speed.

To overcome this drawback, a finger-shaped metal wiring, which is connected to the gate connection layer 34, is formed at the entirety of the chip to transmit the gate signal to the entirety of the chip at a high speed. Typically, the metal wiring is formed of the same metal material as that of the source electrode 12.

A large current flows to the source electrode 12, and thus a metal junction, which is connected to an outer side through bonding, is formed immediately over the MOSFET cell. For this, an aluminum layer, which has a thickness of several micrometers, and the like are used.

In etching processing of a metal layer having a large thickness, it is difficult to avoid side etching at a magnitude equal to or greater than the thickness. According to this, it is desirable to secure several tens of micrometers as a width of the gate finger region in consideration of a manufacturing margin.

For example, a width ("W1" in FIG. 15) of the gate connection layer 34 illustrated in FIG. 15 in the first direction is approximately 60 μm. The gate electrode 18 extends in the first direction from both sides of the gate connection layer 34 toward the main region 50 in which the MOSFET cell is arranged.

As illustrated in FIG. 16, the p-type region 84 is provided on a lower side of the wide gate connection layer 34. The p-type region 84 can shield a high electric field, which extends from a drain electrode 14 side, from the gate connection layer 34 and the field oxide film 81.

Accordingly, a pn junction of the wide p-type region 84 and the drift region 26 exists in the gate finger region. For example, a width ("W2") of the p-type region 84 illustrated in FIG. 16 is approximately 70 μm from the viewpoint of completely covering the gate connection layer 34.

Next, description will be given of a condition that arises when applying the structure of the gate finger region illustrated in FIG. 15 and FIG. 16, for example, to the MOSFET 100 provided with the SBD cell according to the first embodiment.

Figure 17:
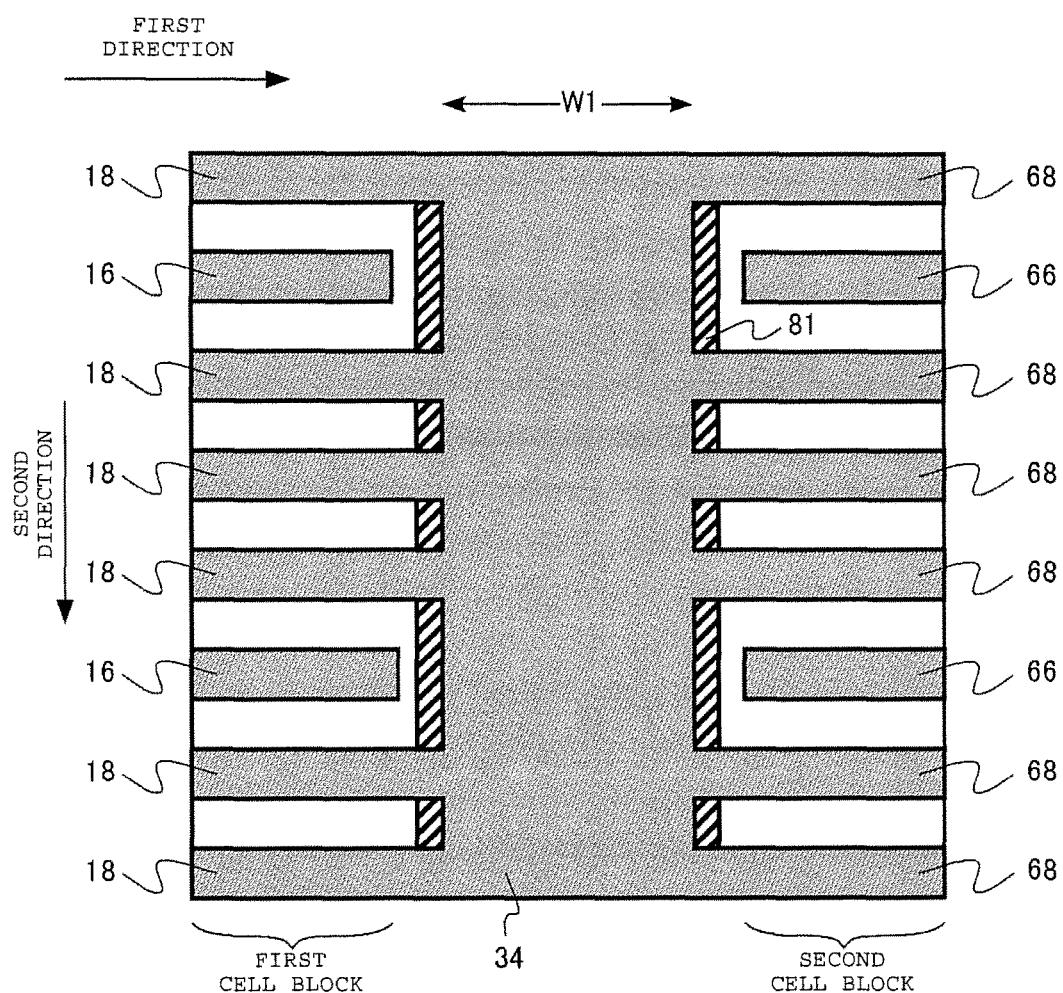
FIG. 17 is an explanatory view of an operation and an effect of the semiconductor device according to the third embodiment.
Figure 18:
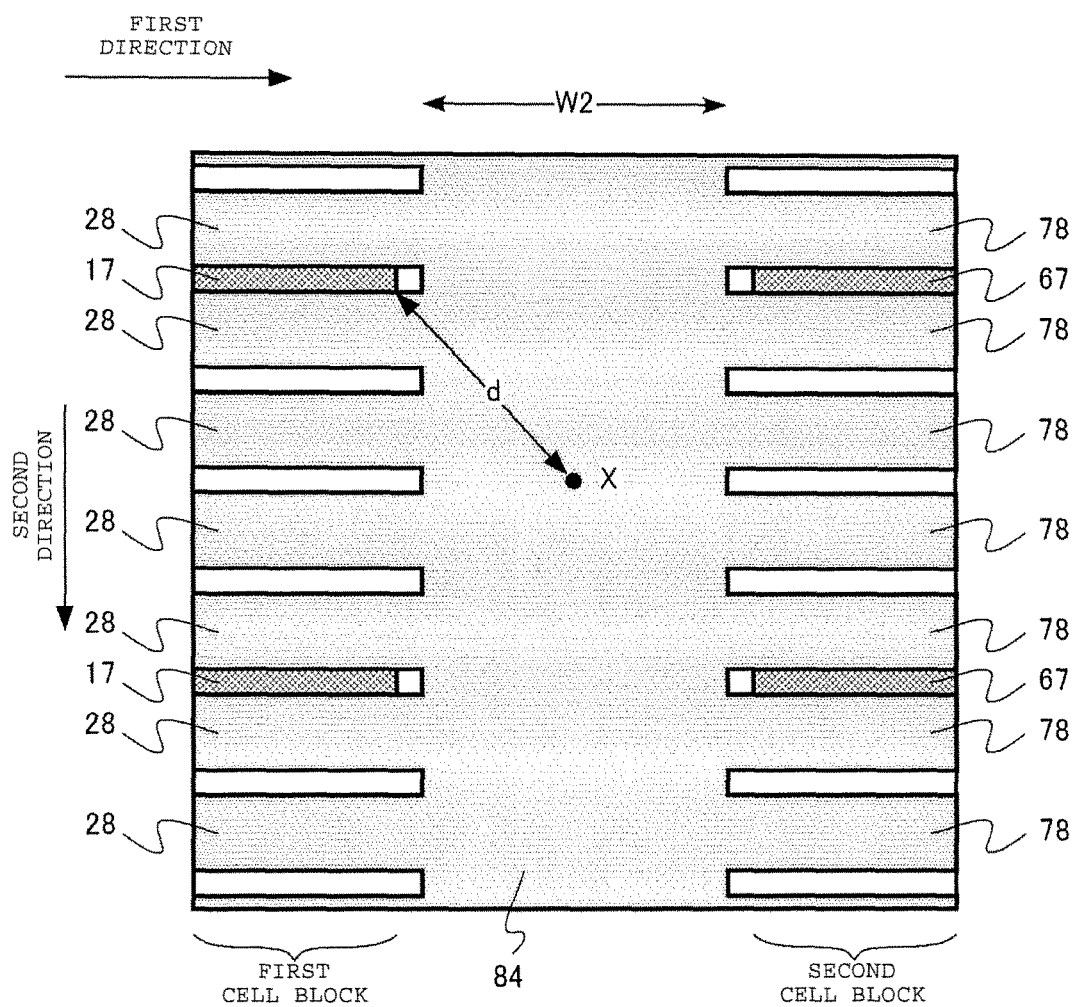
FIG. 18 is an explanatory view of an operation and an effect of the semiconductor device according to the third embodiment.

FIG. 17 and FIG. 18 are schematic plan views of the gate finger region when the SBD cell is provided. FIG. 17 illustrates patterns of the field oxide film, the anode electrode, the gate electrode, and the gate connection layer in the gate finger region. FIG. 18 illustrates patterns of the p-type silicon carbide region and the SBD region in the gate finger region.

As illustrated in FIG. 17, the anode electrode 16 and the anode electrode 66 are separated from each other by the gate connection layer 34 interposed therebetween. According to this, as illustrated in FIG. 18, the SBD region 17 and the SBD region 67 are also separated from each other.

For example, when W2 is set as approximately 70 μm, a distance from the SBD regions 17 and 67 to a point X at the center of the p-type region 84 becomes at least as large as approximately 35 μm. According to this, the pn junction diode, which is formed by the p-type region 84 and the drift region 26, is hardly susceptible to an effect of a plurality of the SBD cells which are connected in parallel.

Figure 19:
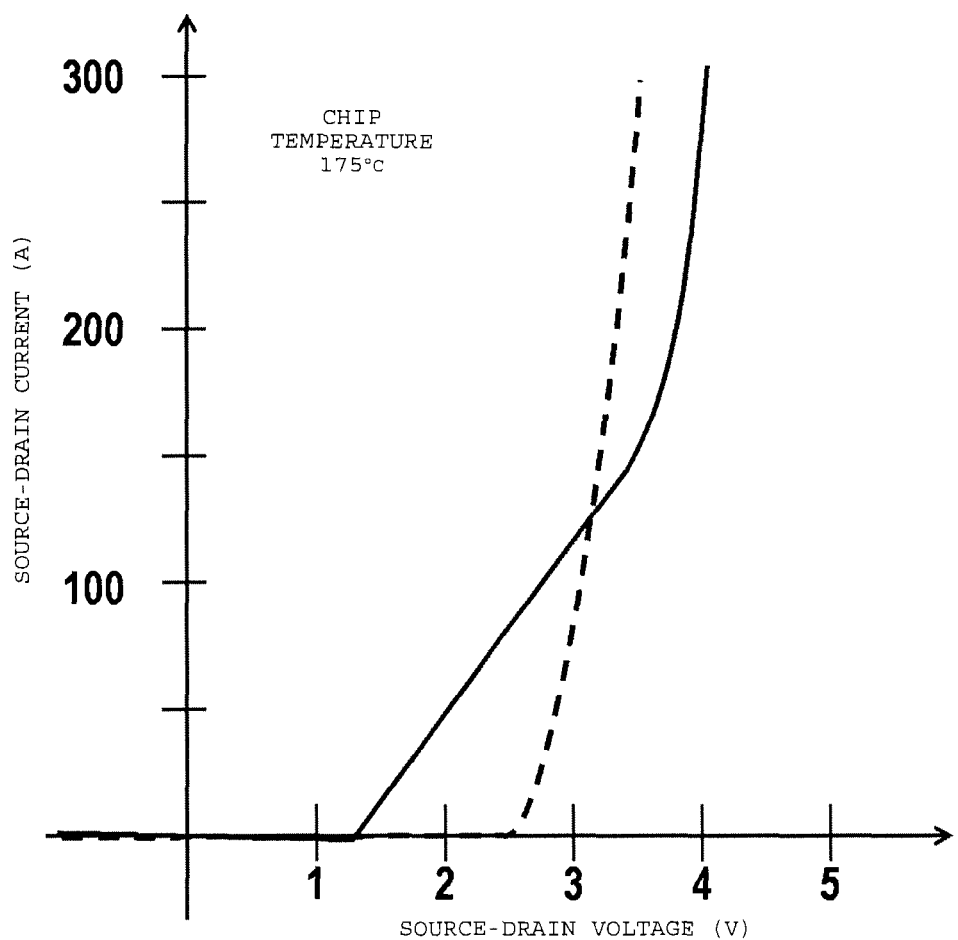
FIG. 19 is an explanatory view of an operation and an effect of the semiconductor device according to the third embodiment.

Accordingly, as indicated by a dotted line in FIG. 19, a current flows at an on-state voltage of approximately 2.5 V through a pn junction diode formed by the p-type region 84 and the drift region 26. The main region 50 is set in order for injection of a hole from the base region 28 to the drift region 26 to be suppressed up to 3.4 V. as indicated by a solid line in FIG. 19. However, in the structure in FIG. 17 and FIG. 18, when a source-drain voltage exceeds 2.5 V, injection of a hole to the drift region 26 starts at the pn junction in the gate finger region, and thus conduction deterioration may occur.

According to this, it is desirable that the SBD region is also arranged with a predetermined interval at a pn junction portion of the supplementary regions other than the main region 50, such as the gate finger region 54, so as to suppress injection of a hole from the pn junction portion in the supplementary regions to the drift region 26.

In this embodiment, the p-type region 84 is divided into portions in the second direction. The SBD region 17 and the SBD region 67 are connected to each other, and are located between the divided portions of the p-type region 84.

Figure 20:
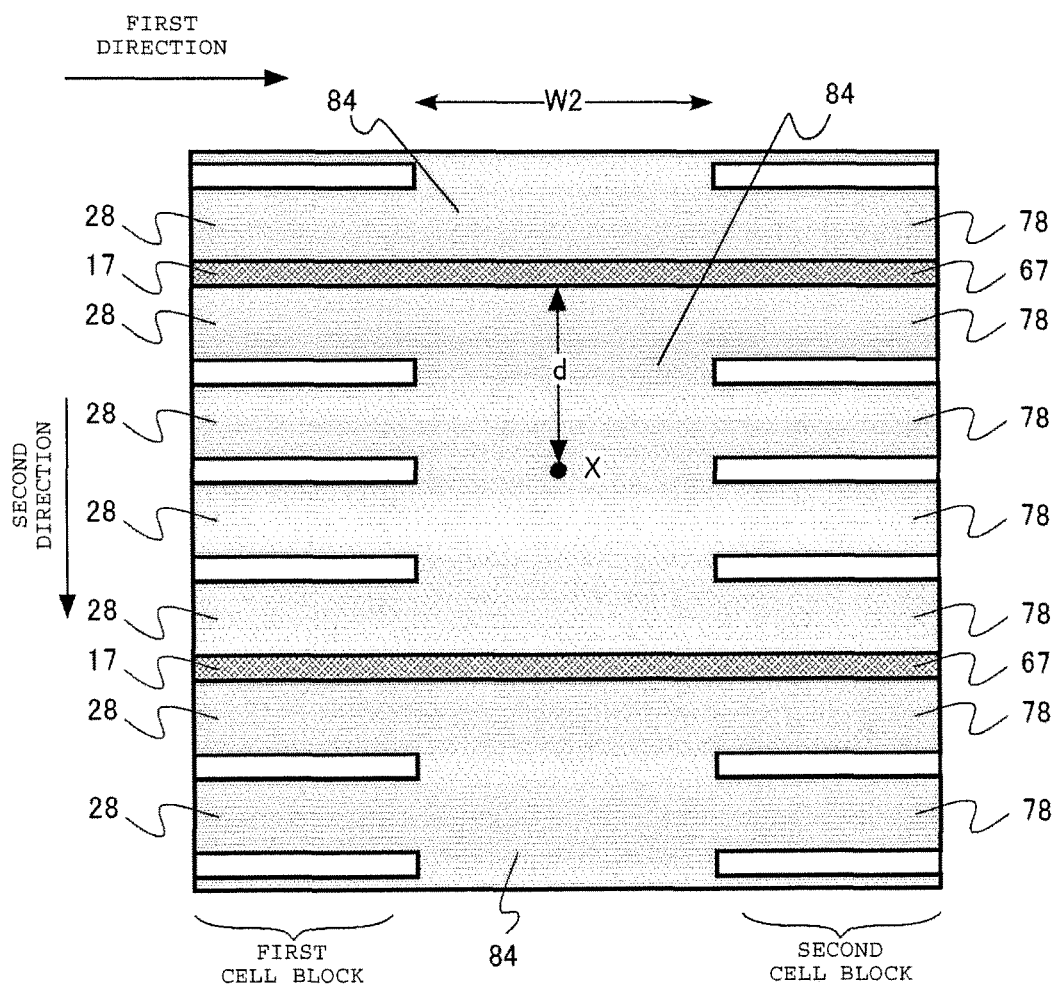
FIG. 20 is an explanatory view of an operation and an effect of the semiconductor device according to the third embodiment.

According to this, as illustrated in FIG. 20, a distance ("d" in FIG. 20) from the SBD regions 17 and 67 to the point X becomes shorter than the distance "d" in the example illustrated in FIG. 18. For example, when the width of the base region 28 is set as approximately 2.5 μm, and the interval thereof is set as approximately 1.5 μm, even when W2 is set as approximately 70 μm, the distance d becomes approximately 7.25 μm, or less. Accordingly, flowing of a current to the pn junction diode formed by the p-type region 84 and the drift region 26 is suppressed.

As discussed above, the first period corresponds to a repetitive period of a combination of the SBD cell and the MOSFET cell(s) in the main region 50. In the main region 50, a maximum distance from the SBD region 17 to the base region 28 is less than a half of the first period.

As described above with respect to the first embodiment, when n MOSFET cells are arranged with respect to one SBD cell, it is desirable that n is 5 or less from the viewpoint of suppressing conduction deterioration. In the supplementary regions, it is desirable that a distance from the SBD region to the pn junction in the supplementary regions does not exceed what a distance from the SBD region to the pn junction in the main region 50 would be, where n in the main region set to 5, or regardless of what n of the main region 50 is actually set.

When n is set according to a function, a first period corresponding to n (=5) in the main region 50 is equal to 6/(n+1) times the actual first period of the main region. Accordingly, it is desirable that a distance from the SBD region to the pn junction in the supplementary regions is less than a half of 6/(n+1) times the actual first period in the main region 50.

In addition, it is more desirable that the distance from the SBD region to the pn junction in the supplementary regions is less than a half of the first period from the viewpoint of making the distance from the SBD region to the pn junction substantially the same as, or similar to, that in the main region 50.

In this embodiment, when a width of the base region 28 is set as approximately 2.5 μm, and an interval thereof is set as approximately 1.5 μm, a half of 6/(n+1) times the first period becomes approximately 12 μm because n is set as 3. In addition, half of the first period becomes approximately 8 μm. The distance d is approximately 7.25 μm or less, and thus both of less than of the half of 6/(n+1) times the first period, and less than of the half the first period are satisfied.

According to this embodiment, in addition to the main region 50, flowing a current to the pn junction diode of the gate finger region 54, which is a supplementary region, is suppressed. Accordingly, it is possible to further improve reliability by suppressing conduction deterioration in comparison to the first embodiment.

Fourth Embodiment

A semiconductor device according to a fourth example embodiment differs in some respects from the third embodiment, such as in the structure of the gate finger region. Description of components similarly configured as those described above with respect to the third embodiment will be omitted.

Figure 21:
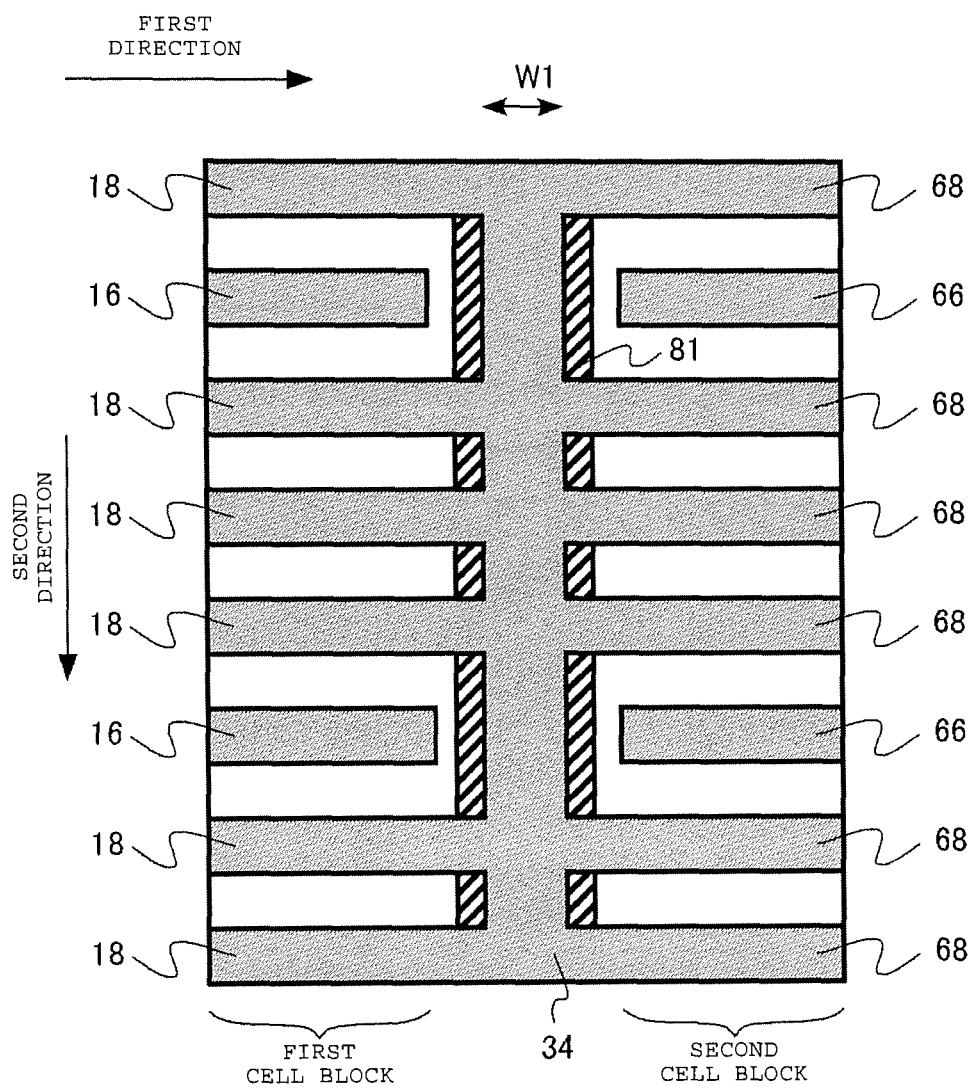
FIG. 21 a schematic plan view of a gate finger region according to a fourth embodiment.
Figure 22:
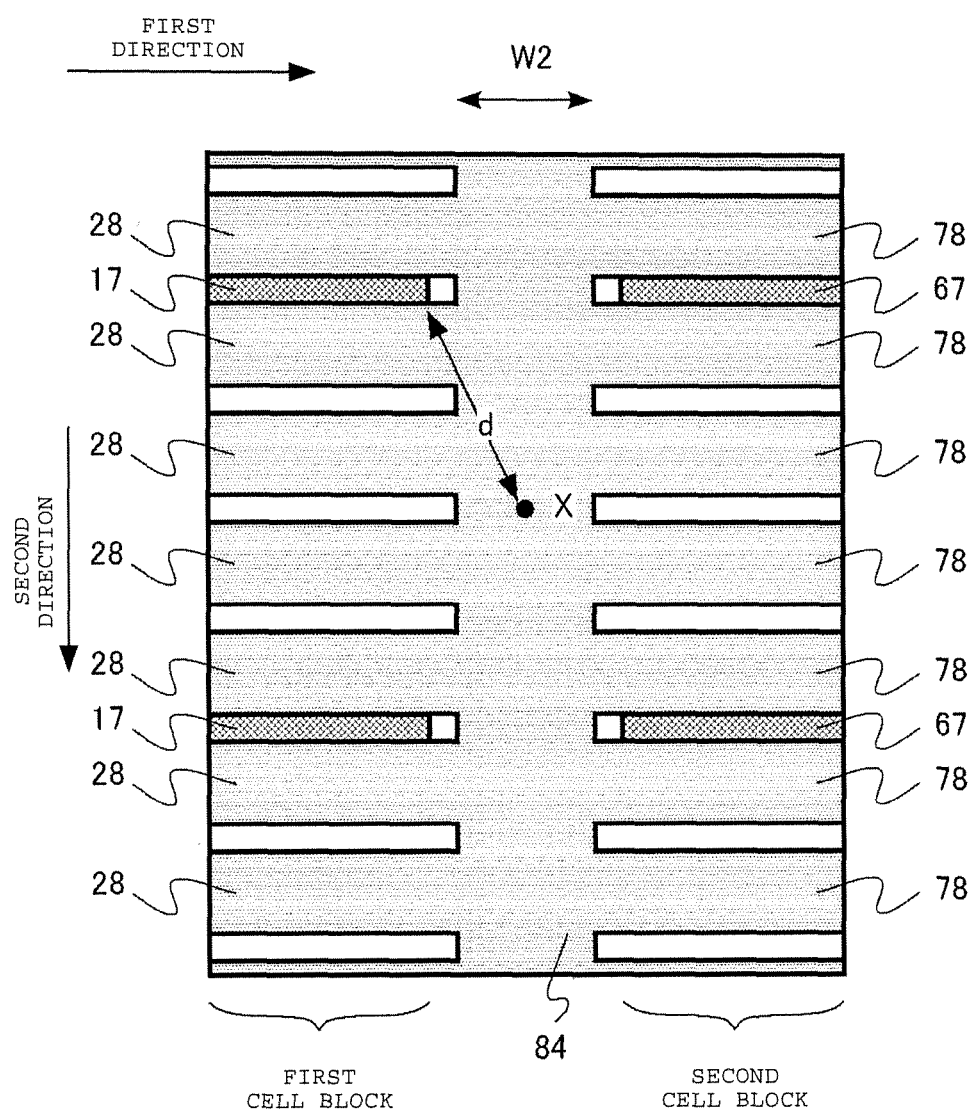
FIG. 22 is a schematic plan view of the gate finger region according to the fourth embodiment.

FIG. 21 and FIG. 22 are schematic plan views of the gate finger region according to this embodiment. FIG. 21 illustrates patterns of the field oxide film, the anode electrode, the gate electrode, and the gate connection layer in the gate finger region. FIG. 22 illustrates patterns of the p-type silicon carbide region and the SBD region in the gate finger region.

In this embodiment, the gate connection layer 34 and the p-type region 84 are not divided into portions arrayed in the second direction, and a width ("W1" in FIG. 21) of the gate connection layer 34 in the first direction and a width ("W2" in FIG. 22) of the p-type region 84 in the first direction are reduced, as compared to some other embodiments. According to this embodiment, the distance ("d" in FIG. 22) from the SBD regions 17 and 67 to the point X becomes shorter.

For example, when a width of the base region 28 is set as approximately 2.5 μm, an interval thereof is set as approximately 1.5 μm, and W1 is set as approximately 3 μm, the distance d from the SBD regions 17 and 67 to the point X becomes approximately 8.3 μm or less.

In this embodiment, when the width of the base region 28 is set as approximately 2.5 μm, and the interval is set as approximately 1.5 μm, a half of 6/(n+1) times the first period becomes approximately 12 μm because n is set as 3. In addition, half of the first period becomes approximately 8 μm. Accordingly, a condition that the distance d from the SBD regions 17 and 67 to the point X be less than a half of 6/(n+1) times the first period is satisfied, but a condition that the distance d from the SBD regions 17 and 67 to the point X be less than the half of the first period is not satisfied.

According to this embodiment, as is the case with the third embodiment, in addition to the main region 50, flowing of a current to a pn junction diode of the gate finger region 54, which is a supplementary region, is suppressed. Accordingly, it is possible to further improve reliability by suppressing conduction deterioration in comparison to the first embodiment.

Fifth Embodiment

A semiconductor device according to a fifth example embodiment can differ from the third and fourth embodiments in some ways, such as in the structure of the gate finger region. Description of components similarly configured as those described above with respect to the third and fourth embodiments will be omitted.

Figure 23:
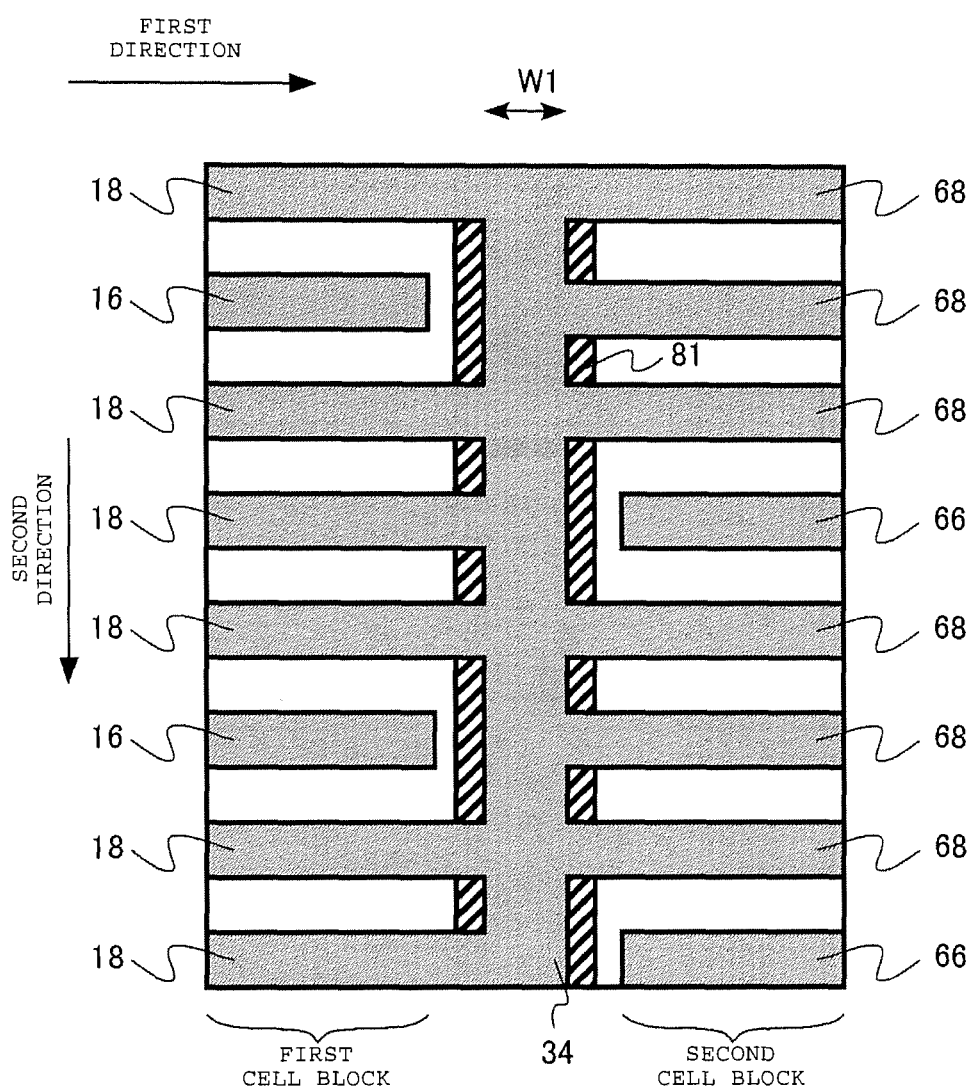
FIG. 23 is a schematic plan view of a gate finger region according to a fifth embodiment.
Figure 24:
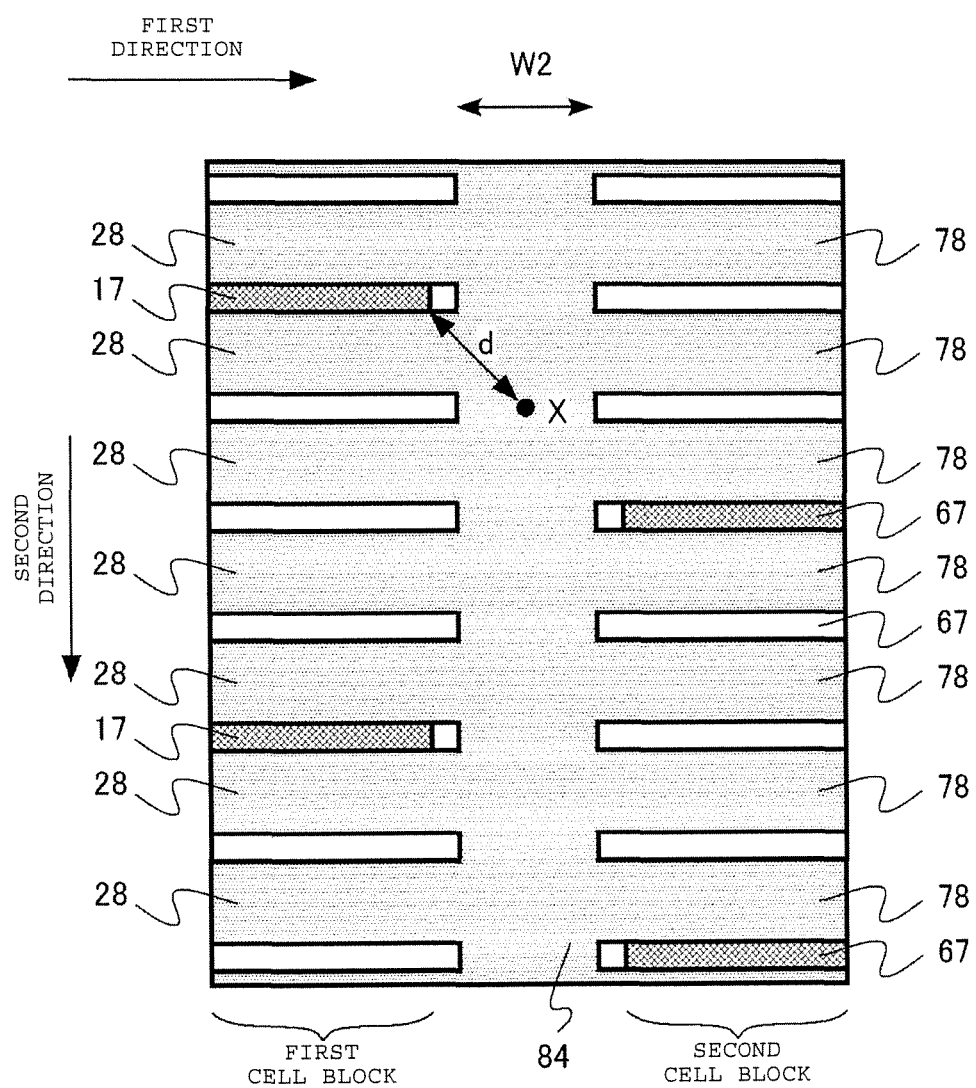
FIG. 24 is a schematic plan view of the gate finger region according to the fifth embodiment.

FIG. 23 and FIG. 24 are schematic plan views of the gate finger region according to this embodiment. FIG. 23 illustrates patterns of the field oxide film, the anode electrode, the gate electrode, and the gate connection layer in the gate finger region. FIG. 24 illustrates patterns of the p-type silicon carbide region and the SBD region in the gate finger region.

In this embodiment, an anode electrode 16 and an anode electrode 66 are arranged between the first cell block and the second cell block to deviate from each other by a half period. In other words, the anode electrode 16 is disposed a distance of half a period from the anode electrode 66 in the second direction. According to this, the distance from the SBD regions 17 and 67 to the point X ("d" in FIG. 24) becomes shorter.

For example, when a width of the base region 28 is set as approximately 2.5 μm, an interval thereof is set as approximately 1.5 μm, and W1 is set as approximately 3 μm, the distance d from the SBD regions 17 and 67 to the point X becomes approximately 7.6 μm or less.

In this embodiment, when the width of the base region 28 is set as approximately 2.5 μm, and the interval is set as approximately 1.5 μm, a half of 6/(n+1) times the first period becomes approximately 12 μm because n is set as 3. In addition, the half of the first period becomes approximately 8 μm. Accordingly, a condition that the distance d from the SBD regions 17 and 67 to the point X be less than the half of 6(n+1) times of the first period, and a condition that the distance d from the SBD regions 17 and 67 to the point X be less than the half of the first period are satisfied.

According to this embodiment, as is the case with the third and fourth embodiments, in addition to the main region 50, flowing of a current to a pn junction diode of the gate finger region 54, which is a supplementary region, is suppressed. According to this, it is possible to further improve reliability by suppressing conduction deterioration in comparison to the first embodiment.

Sixth Embodiment

In comparison to the first embodiment, a semiconductor device according to a sixth example embodiment further includes: a third electrode that is electrically connected to the first electrode; a plurality of p-type fifth silicon carbide regions which are provided in the silicon carbide layer and between the n-type first silicon carbide region and the third electrode, and extend in the first direction; a plurality of n-type sixth silicon carbide regions each of which is provided in the silicon carbide layer and between each of the p-type fifth silicon carbide regions and the third electrode, has an n-type impurity concentration higher than an n-type impurity concentration of the n-type first silicon carbide region, and is electrically connected to the third electrode; a plurality of second conductive layers each of which is in contact with the n-type first silicon carbide region that is provided between two adjacent p-type fifth silicon carbide regions among the plurality of p-type fifth silicon carbide regions, extends in the first direction, is provided in the first period, and is electrically connected to the third electrode; n (n=2, 3, 4, or 5) second gate electrodes that are provided between two adjacent second conductive layers among the plurality of second conductive layers, and extend in the first direction; a plurality of second gate insulating layers each of which is provided between each of the n second gate electrodes and the n-type first silicon carbide region; a gate layer that is provided between the n first gate electrodes and the n second gate electrodes, is connected to ends of the n first gate electrodes and ends of the n second gate electrodes, and is wider than the n first gate electrodes and the n second gate electrodes; an insulating layer that is provided between the gate layer and the n-type first silicon carbide region, and is thicker than the first gate insulating layer and the second gate insulating layer; and a p-type eighth silicon carbide region that is provided in the silicon carbide layer and between the n-type first silicon carbide region and the insulating layer, is connected to the p-type second silicon carbide regions that are provided between the two adjacent first conductive layers, is connected to the p-type fifth silicon carbide regions that are provided between the two adjacent second conductive layers, and has a p-type impurity concentration lower than a p-type impurity concentration of the p-type second silicon carbide regions and the p-type fifth silicon carbide regions. Hereinafter, description of components similarly configured as those of the first and third embodiments will be omitted.

Figure 25:
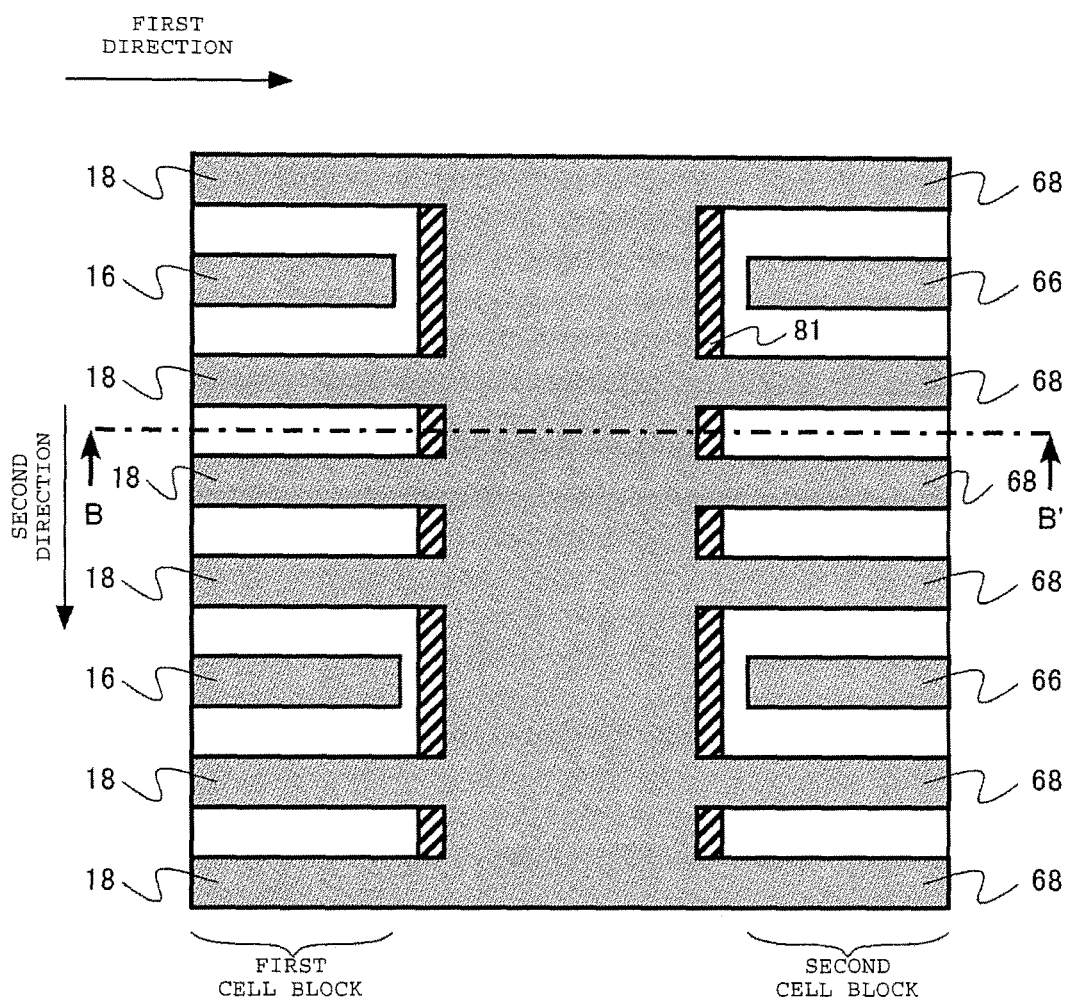
FIG. 25 is a schematic plan view of a gate finger region according to a sixth embodiment.
Figure 26:
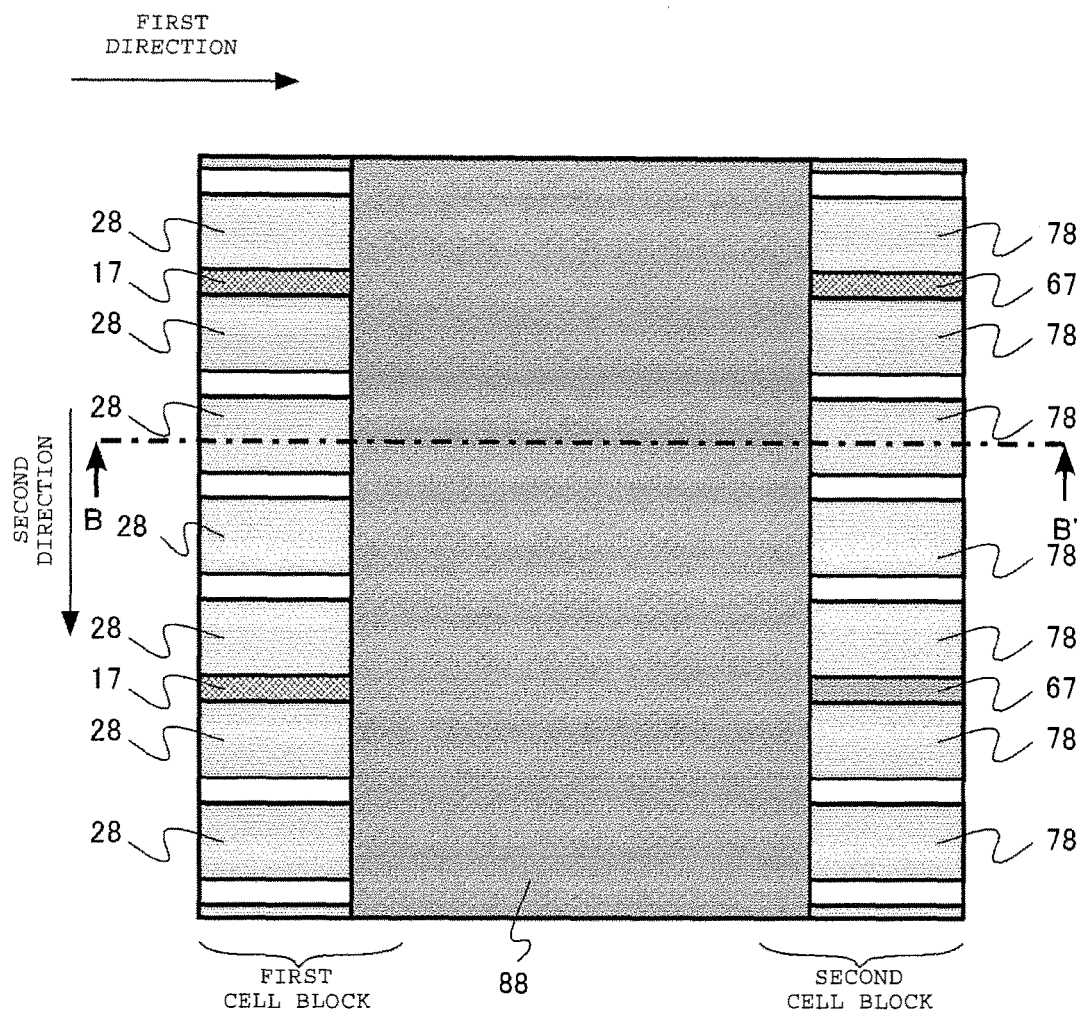
FIG. 26 is a schematic plan view of the gate finger region according to the sixth embodiment.

FIG. 25 and FIG. 26 are schematic plan views of a gate finger region according to this embodiment. FIG. 25 illustrates patterns of the field oxide film, the anode electrode, the gate electrode, and the gate connection layer in the gate finger region. FIG. 26 illustrates patterns of the p-type silicon carbide region and the SBD region in the gate finger region.

In the gate finger region 54, the first cell block and the second cell block are provided with the gate connection layer (gate layer) 34 interposed therebetween. For example, the first cell block has the structure illustrated in FIG. 1 according to the first embodiment. For example, the second cell block has the structure illustrated in FIG. 12 according to the third embodiment.

Furthermore, the first cell block and the second cell block can be, for example, similar to the structure illustrated in FIG. 8 according to the second embodiment.

Figure 27:
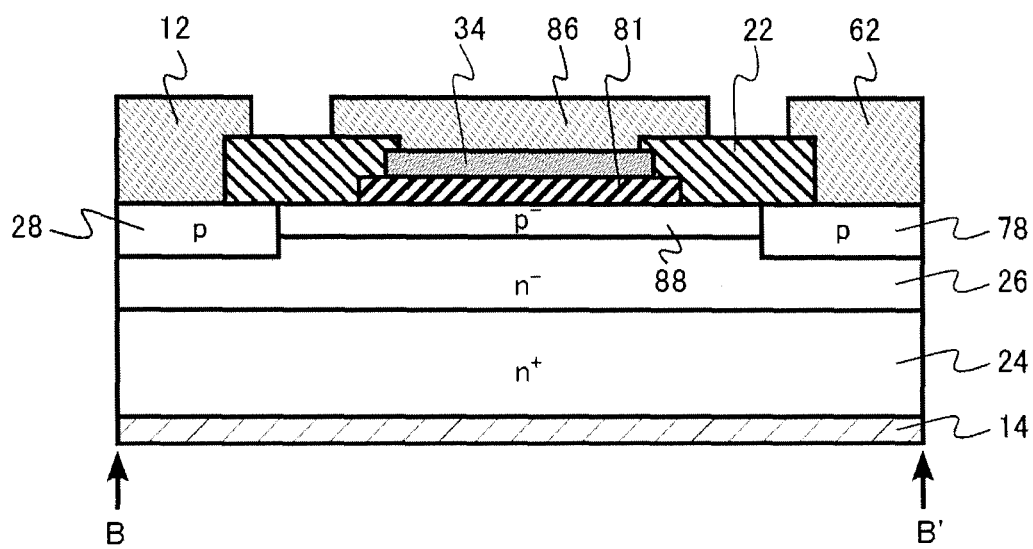
FIG. 27 is a schematic cross-sectional view of the gate finger region according to the sixth embodiment.

FIG. 27 is a schematic cross-sectional view of the gate finger region according to this embodiment. FIG. 27 is a cross-sectional view taken along line B-B' in FIG. 25 and FIG. 26.

In this embodiment, a p$^-$-type region (p-type eighth silicon carbide region) 88 is provided. The p$^-$-type region 88 is provided in the silicon carbide layer 10. The p$^-$-type region 88 is provided between the drift region 26 and the field oxide film 81.

The p$^-$-type region 88 is connected to four base regions 28, which are provided between two adjacent anode electrodes 16 among a plurality of the anode electrodes 16. A plurality of the above-described arrangements can be provided. In addition, the p$^-$-type region 88 is connected to four base regions 78, which are provided between two adjacent anode electrodes 66 among a plurality of the anode electrodes 66. A plurality of the above-described arrangements can be provided.

A p-type impurity concentration of the p$^-$-type region 88 is less than the p-type impurity concentration of the base regions 28 and the base regions 78. For example, the p-type impurity concentration of the p$^-$-type region 88 is less than the p-type impurity concentration of the base regions 28 and the base regions 78 by one digit or greater. For example, the p-type impurity concentration of the p$^-$-type region 88 is in a range of approximately $1\times10^{16}$ cm$^{-3}$ to approximately $5\times10^{16}$ cm$^{-3}$.

In addition, for example, the p$^-$-type region 88 is shallower than the base regions 28 and the base regions 78. For example, the depth of the base regions 28 is approximately 0.1 μm to approximately 0.3 μm.

Each of the base regions 28 and each of the base regions 78 do not extend on a lower side of the field oxide film 81. According to this, when a drain-to-source electric potential is increased, an electric field may be concentrated at ends of the base regions 28 and 78 of a cell in the vicinity of the gate finger region 54, and breakdown voltage deterioration may occur.

In this embodiment, for prevention of the breakdown voltage deterioration, the p$^-$-type region 88, which is doped to a low-concentration p-type, extends from the ends of the base regions 28 and 78 of a cell in the vicinity of the gate finger region 54 up to a lower side of the field oxide film 81.

According to this configuration, when a reverse bias, which is applied between a drain and a source, is increased, a termination destination of an electric force line which ranges from the drain region 24 to the base regions 28 and 78 is dispersed to the p$^-$-type region 88. According to this, it is possible to avoid concentration to the ends of the base regions 28 and 78 in a cell.

For example, the low-concentration p$^-$-type region 88 can be formed simultaneously in a process of forming a termination region, such as the termination region 56 depicted in FIG. 10, in the vicinity of the chip. For example, the low-concentration p$^-$-type region 88 can be formed with the termination region 56 in a single formation process. Accordingly, it is possible to avoid an electric field being concentrated at ends of the base regions 28 and 78 of a cell in the vicinity of the gate finger region 54, without being accompanied with an increase in a chip manufacturing process.

In addition, even when a forward bias voltage is applied to a drain-to-source junction, since resistance of the low-concentration p$^-$-type region 88 is very large, a current hardly flows. Accordingly, injection of a hole to the drift region 26 is suppressed, and thus it is possible to avoid a problem related to reliability due to expansion of the stacking defect.

According to this embodiment, in addition to the main region 50, flowing of a current to the pn junction diode of the gate finger region 54, which is a supplementary region, is suppressed. Accordingly, it is possible to further improve reliability by suppressing conduction deterioration in comparison to the first embodiment.

Seventh Embodiment

In comparison to the first embodiment, a semiconductor device of an example seventh embodiment further includes: a third electrode that is electrically connected to the first electrode; a plurality of p-type fifth silicon carbide regions that are provided in the silicon carbide layer and between the n-type first silicon carbide region and the third electrode, and extend in the first direction; a plurality of n-type sixth silicon carbide regions each of which is provided in the silicon carbide layer and between each of the p-type fifth silicon carbide regions and the third electrode, has an n-type impurity concentration higher than an n-type impurity concentration of the n-type first silicon carbide region, and is electrically connected to the third electrode; a plurality of second conductive layers each of which is in contact with the n-type first silicon carbide region that is provided between two adjacent p-type fifth silicon carbide regions among the plurality of p-type fifth silicon carbide regions, extends in the first direction, is provided in the first period, and is electrically connected to the third electrode; n (n=2, 3, 4, or 5) second gate electrodes that are provided between two adjacent second conductive layers among the plurality of second conductive layers, and extend in the first direction; a plurality of second gate insulating layers each of which is provided between each of the n second gate electrodes and the n-type first silicon carbide region; agate layer that is provided between the n first gate electrodes and the n second gate electrodes, is connected to ends of the n first gate electrodes and ends of then second gate electrodes, and is wider than the n first gate electrodes and the n second gate electrodes; an insulating layer that is provided between the gate layer and the n-type first silicon carbide region, and is thicker than the first gate insulating layer and the second gate insulating layer; and a p-type ninth silicon carbide region that is provided in the silicon carbide layer, and between the n-type first silicon carbide region and the insulating layer and between each of the p-type second silicon carbide regions and each of the p-type fifth silicon carbide regions, and is spaced away from the p-type second silicon carbide region and the p-type fifth silicon carbide region. Hereinafter, description of components similarly configured as those described above in reference to the first and third embodiments will be omitted.

Figure 28:
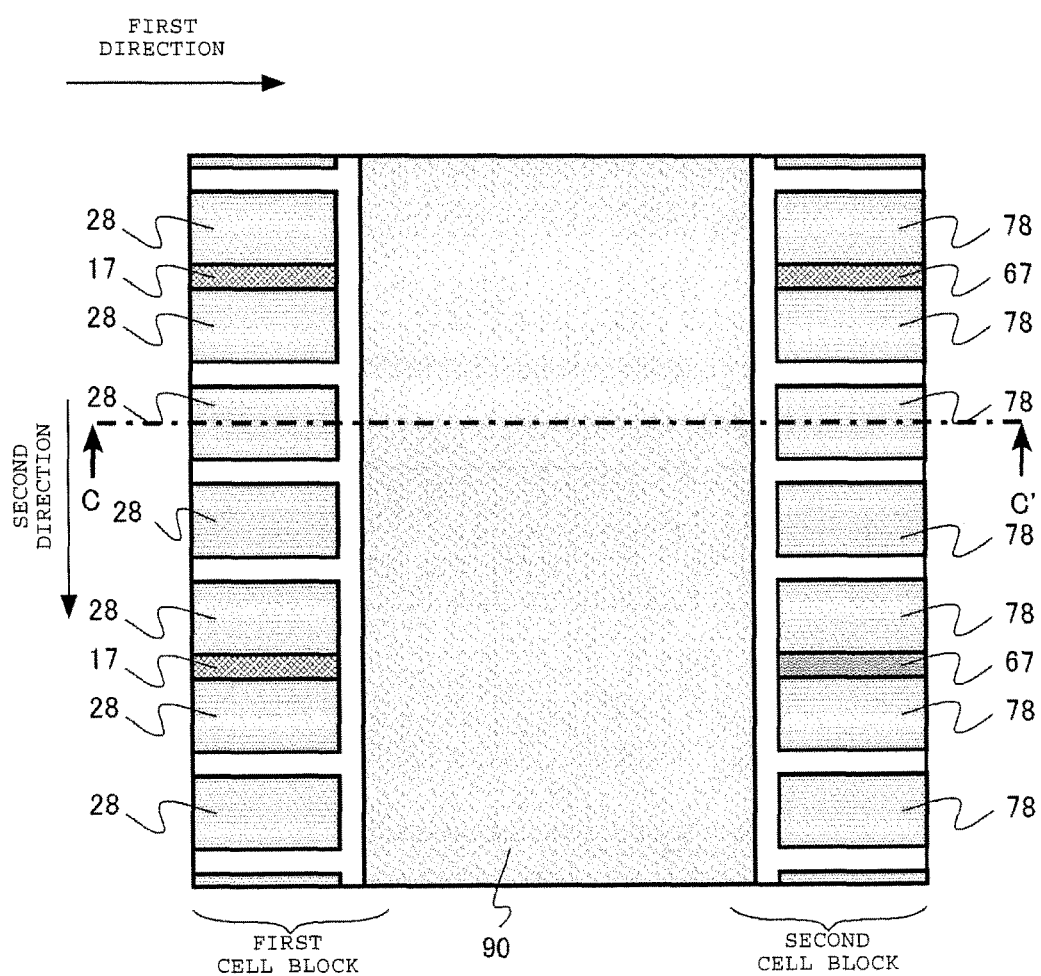
FIG. 28 is a schematic plan view of a gate finger region according to a seventh embodiment.

FIG. 28 is a schematic plan view of a gate finger region according to this embodiment. FIG. 28 illustrates patterns of the p-type silicon carbide region and the SBD region in the gate finger region.

In the gate finger region 54, the first cell block and the second cell block are provided with the gate connection layer (gate layer) 34 interposed therebetween. For example, the first cell block has a structure similar to the structure illustrated in FIG. 1 according to the first embodiment. For example, the second cell block has a structure similar to the structure illustrated in FIG. 12 according to the third embodiment.

Furthermore, for the first cell block and the second cell block, for example, a structure similar to the structure illustrated in FIG. 8 according to the second embodiment can be implemented.

Figure 29:
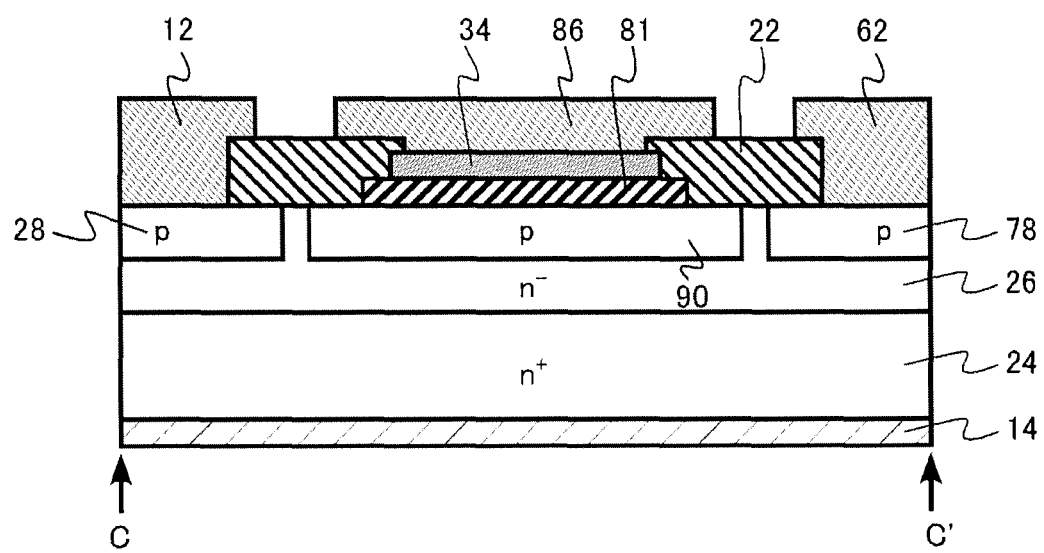
FIG. 29 is a schematic cross-sectional view of the gate finger region according to the seventh embodiment.

FIG. 29 is a schematic cross-sectional view of the gate finger region according to this embodiment. FIG. 29 is a cross-sectional view taken along line C-C' in FIG. 28.

In this embodiment, a p-type region (ninth silicon carbide region) 90 is provided. The p-type region 90 is provided in the silicon carbide layer 10. The p-type region 90 is provided between the drift region 26 and the field oxide film 81.

The p-type region 90 is provided between the base region 28 and the base region 78. In addition, the p-type region 90 and the base region 28 are spaced away from each other. In addition, the p-type region 90 and the base region 78 are spaced away from each other.

The p-type region 90 has approximately the same p-type impurity concentration and depth as those of the base region 28 and the base region 78. The p-type region 90 is formed simultaneously with the base region 28 and the base region 78. The p-type region 90 can be formed in a single formation process with the base region 28 and the base region 78.

The p-type region 90 is not electrically connected to any of the source electrode 12 or to the source electrode 62. The p-type region 90 is in a floating state in which an electric potential is not fixed.

A connection between the p-type region 90 and the source electrodes 12 and 62 is not established in the structure of the seventh example embodiment. Accordingly, even when a forward bias voltage is applied between a drain and a source, a hole is not injected to the drift region 26 on a lower side of the gate finger region 54.

On the other hand, when a reverse bias is applied between the drain and the source, if a distance between the p-type region 90 and the base regions 28 and 78 in a cell portion of the MOSFET is small, an electric potential of the p-type region 90 becomes approximately the same as that of the base regions 28 and 78 of the cell portion of the MOSFET. Accordingly, a termination destination of an electric force line also becomes approximately uniform on a lower side of the gate finger region 54, and thus it is possible to avoid occurrence of a problem such as a decrease in a breakdown voltage due to electric field concentration.

It is desirable that a distance between the p-type region 90 and the base region 28 is substantially equal to or less than a distance between adjacent base regions 28 among a plurality of base regions 28, and a distance between the p-type region 90 and the base region 78 is substantially equal to or less than a distance between adjacent base regions 78 among a plurality of the base regions 78 from the viewpoint of mitigating electric field concentration.

According to this embodiment, in addition to the main region 50, flowing of a current to the pn junction diode of the gate finger region 54, which is a supplementary region, is suppressed. Accordingly, it is possible to further improve reliability by suppressing conduction deterioration in comparison to the first embodiment.

In the third to seventh embodiments, as the supplementary region, the gate finger region 54 is described as an example. Even in the other supplementary regions such as the termination region 56 having the pn junction obtained by the p-type base regions 28 and 78 and the n⁻-type drift region 26, and the gate pad region 52, division of the pn junction region or cutting-out of the pn junction region may be performed, an electrode material, which forms a Schottky junction with the drift region 26, may be arranged in the resultant division boundary or cut-out region of the pn junction region, the Schottky junction material may be connected to the source electrodes 12 and 62, and the Schottky junction, which is connected to the pn junction of the supplementary region in parallel, may be provided in the vicinity of the pn junction. According to this configuration, it is possible to increase a threshold value of a current and a voltage at which the pn junction enters an on-state. In addition, an aluminum wiring layer may be provided on the supplementary region through an insulating film as applicable, and an opening may be provided in the insulating film as applicable to secure electrical connection between the aluminum electrode and a predetermined portion of the supplementary region. According to this, it is possible to maintain a function of the supplementary region.

In the first to seventh embodiments, description is given of a case where the crystal structure of SiC is 4H—SiC as an example, but it is also possible to apply the embodiment to a device using SiC having other crystal structures such as 6H—SiC and 3C—SiC. In addition, a plane other than the (0001) plane is also applicable to the front surface of the silicon carbide layer 10.

In the first to seventh embodiments, aluminum (Al) is an example of the p-type impurity, but it is also possible to use boron (B). In addition, nitrogen (N) and phosphorous (P) are examples of the n-type impurity, but it is also possible to apply arsenic (As), antimony (Sb), and the like as the n-type impurity.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A semiconductor device, comprising:
a first electrode;
a second electrode;
a silicon carbide layer of which at least a portion is provided between the first electrode and the second electrode, the silicon carbide layer including
an n-type first silicon carbide region that is provided in the silicon carbide layer;
a plurality of p-type second silicon carbide regions that are each provided in the silicon carbide layer between the n-type first silicon carbide region and the first electrode, and extend in a first direction; and
a plurality of n-type third silicon carbide regions each of which is provided in the silicon carbide layer between one of the plurality of p-type second silicon carbide regions and the first electrode, has an n-type impurity concentration higher than an n-type impurity concentration of the n-type first silicon carbide region, and is electrically connected to the first electrode;
a plurality of first conductive layers each of which is in contact with the n-type first silicon carbide region between two adjacent p-type second silicon carbide regions of the plurality of p-type second silicon carbide regions, extends in the first direction, is provided in a first period, and is electrically connected to the first electrode;
a number n, n being 2, 3, 4 or 5, of first gate electrodes that are provided between two adjacent first conductive layers of the plurality of first conductive layers, and extend in the first direction; and
a plurality of first gate insulating layers each of which is provided between one of the n first gate electrodes and the n-type first silicon carbide region.

2. The device according to claim 1,
wherein a junction between each of the plurality of first conductive layers and the n-type first silicon carbide region is a hetero-junction or a Schottky junction.

3. The device according to claim 1, further comprising:
a plurality of p-type fourth silicon carbide regions each of which is provided in the silicon carbide layer between one of the plurality of p-type second silicon carbide regions and the first electrode, has a p-type impurity concentration higher than a p-type impurity concentration of the plurality of p-type second silicon carbide regions, and is electrically connected to the first electrode.

4. The device according to claim 1,
wherein the plurality of p-type second silicon carbide regions are provided in a second period that is approximately $1/(n+1)$ times the first period.

5. The device according to claim 1,
wherein the plurality of first conductive layers and the n first gate electrodes include n-type or p-type polycrystal silicon.

6. The device according to claim 1,
wherein the plurality of first conductive layers are a portion of the first electrode, and the n first gate electrodes include n-type or p-type polycrystal silicon.

7. The device according to claim 1, further comprising:
a third electrode that is electrically connected to the first electrode;
a plurality of p-type fifth silicon carbide regions that are each provided in the silicon carbide layer between the n-type first silicon carbide region and the third electrode, and extend in the first direction;
a plurality of n-type sixth silicon carbide regions each of which is provided in the silicon carbide layer between one of the plurality of p-type fifth silicon carbide regions and the third electrode, has an n-type impurity concentration higher than an n-type impurity concentration of the n-type first silicon carbide region, and is electrically connected to the third electrode;
a plurality of second conductive layers each of which is in contact with the n-type first silicon carbide region between two adjacent p-type fifth silicon carbide regions of the plurality of p-type fifth silicon carbide regions, extends in the first direction, is provided in the first period, and is electrically connected to the third electrode;
a number n, n being 2, 3, 4 or 5, of second gate electrodes which are provided between two adjacent second conductive layers of the plurality of second conductive layers, and extend in the first direction;
a plurality of second gate insulating layers each of which is provided between one of the n second gate electrodes and the n-type first silicon carbide region;
a gate layer that is provided between the n first gate electrodes and the n second gate electrodes, is connected to ends of the n first gate electrodes and ends of the n second gate electrodes, and is wider than the n first gate electrodes and the n second gate electrodes;
an insulating layer that is provided between the gate layer and the n-type first silicon carbide region, and is thicker than the plurality of first gate insulating layers and the plurality of second gate insulating layers; and
a p-type seventh silicon carbide region that is provided in the silicon carbide layer between the n-type first silicon carbide region and the insulating layer, is connected to at least a subset of the plurality of p-type second silicon carbide regions, and is connected to at least a subset of the plurality of p-type fifth silicon carbide regions.

8. The device according to claim 7,
wherein a distance between an arbitrary position of the p-type seventh silicon carbide region and a portion at which any one of two adjacent first conductive layers and the n-type first silicon carbide region are in contact with each other, or a portion at which any one of two adjacent second conductive layers and the n-type first silicon carbide region are in contact with each other is less than a half of $6/(n+1)$ times the first period.

9. The device according to claim 7,
wherein a distance between an arbitrary position of the p-type seventh silicon carbide region and a portion at which any one of two adjacent first conductive layers and the n-type first silicon carbide region are in contact with each other, or a portion at which any one of two adjacent second conductive layers and the n-type first silicon carbide region are in contact with each other, is less than a half of the first period.

10. The device according to claim 7,
wherein the plurality of first conductive layers and the plurality of second conductive layers are connected to each other.

11. The device according to claim 8,
wherein the plurality of first conductive layers and the plurality of second conductive layers are connected to each other.

12. The device according to claim 9,
wherein the plurality of first conductive layers and the plurality of second conductive layers are connected to each other.

13. The device according to claim 1, further comprising:
a third electrode that is electrically connected to the first electrode;
a plurality of p-type fifth silicon carbide regions that are each provided in the silicon carbide layer between the n-type first silicon carbide region and the third electrode, and extend in the first direction;
a plurality of n-type sixth silicon carbide regions each of which is provided in the silicon carbide layer between one of the plurality of p-type fifth silicon carbide regions and the third electrode, has an n-type impurity concentration higher than an n-type impurity concentration of the n-type first silicon carbide region, and is electrically connected to the third electrode;
a plurality of second conductive layers each of which is in contact with the n-type first silicon carbide region between two adjacent p-type fifth silicon carbide regions of the plurality of p-type fifth silicon carbide regions, extends in the first direction, is provided in the first period, and is electrically connected to the third electrode;
a number n, n being 2, 3, 4, or 5, of second gate electrodes which are provided between two adjacent second conductive layers of the plurality of second conductive layers, and extend in the first direction;
a plurality of second gate insulating layers each of which is provided between one of the n second gate electrodes and the n-type first silicon carbide region;
a gate layer that is provided between the n first gate electrodes and the n second gate electrodes, is connected to ends of the n first gate electrodes and ends of the n second gate electrodes, and is wider than the n first gate electrodes and the n second gate electrodes;
an insulating layer that is provided between the gate layer and the n-type first silicon carbide region, and is thicker than the plurality of first gate insulating layers and the plurality of second gate insulating layers; and
a p-type eighth silicon carbide region that is provided in the silicon carbide layer between the n-type first silicon carbide region and the insulating layer, is connected to at least a subset of the plurality of p-type second silicon carbide regions, is connected to at least a subset of the plurality of p-type fifth silicon carbide regions, and has a p-type impurity concentration lower than a p-type impurity concentration of the plurality of p-type second silicon carbide regions and the plurality of p-type fifth silicon carbide regions.

14. The device according to claim 13,
wherein a depth of the p-type eighth silicon carbide region in the silicon carbide layer is shallower than a depth of the plurality of p-type second silicon carbide regions in the silicon carbide layer and a depth of the plurality of p-type fifth silicon carbide regions in the silicon carbide layer.

15. The device according to claim 1, further comprising:
a third electrode that is connected to the first electrode;
a plurality of p-type fifth silicon carbide regions that are each provided in the silicon carbide layer between the n-type first silicon carbide region and the third electrode, and extend in the first direction;
a plurality of n-type sixth silicon carbide regions each of which is provided in the silicon carbide layer between one of the plurality of p-type fifth silicon carbide regions and the third electrode, has an n-type impurity concentration higher than an n-type impurity concentration of the n-type first silicon carbide region, and is electrically connected to the third electrode;
a plurality of second conductive layers each of which is in contact with the n-type first silicon carbide region between two adjacent p-type fifth silicon carbide regions of the plurality of p-type fifth silicon carbide regions, extends in the first direction, is provided in the first period, and is electrically connected to the third electrode;
a number n, n being 2, 3, 4, or 5, of second gate electrodes that are provided between two adjacent second conductive layers of the plurality of second conductive layers, and extend in the first direction;
a plurality of second gate insulating layers each of which is provided between one of the n second gate electrodes and the n-type first silicon carbide region;
a gate layer that is provided between the n first gate electrodes and the n second gate electrodes, is connected to ends of the n first gate electrodes and ends of the n second gate electrodes, and is wider than the n first gate electrodes and the n second gate electrodes;
an insulating layer that is provided between the gate layer and the n-type first silicon carbide region, and is thicker than the plurality of first gate insulating layers and the plurality of second gate insulating layers; and
a p-type ninth silicon carbide region that is provided in the silicon carbide layer, between the n-type first silicon carbide region and the insulating layer and between the plurality of p-type second silicon carbide regions and the plurality of p-type fifth silicon carbide regions, and is spaced away from the plurality of p-type second silicon carbide regions and the plurality of p-type fifth silicon carbide regions.

16. The device according to claim 15,
wherein a distance between each of the plurality of p-type second silicon carbide regions and the p-type ninth silicon carbide region is equal to or less than a distance between two adjacent p-type second silicon carbide regions of the plurality of p-type second silicon carbide regions, and a distance between each of the plurality of p-type fifth silicon carbide regions and the p-type ninth silicon carbide region is equal to or less than a distance between two adjacent p-type fifth silicon carbide regions of the plurality of p-type fifth silicon carbide regions.

* * * * *